(12) United States Patent
Eldridge et al.

(10) Patent No.: US 7,880,489 B2
(45) Date of Patent: Feb. 1, 2011

(54) PRINTING OF REDISTRIBUTION TRACES ON ELECTRONIC COMPONENT

(75) Inventors: Benjamin N. Eldridge, Danville, CA (US); Yoshikazu Hatsukano, Tokyo (JP); Igor Y. Khandros, Orinda, CA (US); Gaetan L. Mathieu, Varennes, CA (US)

(73) Assignee: FormFactor, Inc., Livermore, CA (US)

( * ) Notice: Subject to any disclaimer, the term of this patent is extended or adjusted under 35 U.S.C. 154(b) by 87 days.

(21) Appl. No.: 12/264,751

(22) Filed: Nov. 4, 2008

(65) Prior Publication Data
US 2010/0109688 A1 May 6, 2010

(51) Int. Cl.
*G01R 31/02* (2006.01)
(52) U.S. Cl. ............. 324/760; 324/158.1; 438/52; 702/108; 29/830
(58) Field of Classification Search ............... None
See application file for complete search history.

(56) References Cited

U.S. PATENT DOCUMENTS

| | | | |
|---|---|---|---|
| 6,520,402 B2 * | 2/2003 | Orme-Marmerelis et al. | 228/260 |
| 6,729,019 B2 | 5/2004 | Grube et al. | |
| 6,864,105 B2 | 3/2005 | Grube et al. | |
| 7,444,253 B2 | 10/2008 | Mathieu | |
| 7,619,429 B2 * | 11/2009 | Chou et al. | 324/762 |
| 7,674,112 B2 * | 3/2010 | Gritters et al. | 439/66 |
| 7,683,646 B2 * | 3/2010 | Murata | 324/754 |
| 2001/0018851 A1 * | 9/2001 | Horine | 75/10.1 |
| 2007/0141743 A1 | 6/2007 | Mathieu et al. | |
| 2008/0088010 A1 | 4/2008 | Hobbs et al. | |

OTHER PUBLICATIONS

U.S. Appl. No. 12/259,915, filed Oct. 28, 2008, Khandros.
U.S. Appl. No. 12/343,135, filed Dec. 23, 2008, Gritters.
"ProMetal 3-D Printing Process," ProMetal division of The Ex One Company (Irwin, Pennsylvania), 2 pages, date of first publication unknown, submitted pages printed from http://www.prometal.com/process.html on Apr. 20, 2006.
"ProMetal Equipment," ProMetal division of The Ex One Company (Irwin, Pennsylvania), 2 pages, date of first publication unknown, submitted pages printed from http://www.prometal.com/equipment.html on Apr. 20, 2006.
"Welcome to the ink-jet age" ZDNet.co.uk of CNET Networks, 5 pages, submitted pages printed from http://news.zdnet.co.uk (1995-2006).
"Epson Inkjet Technology Used to Fabricate World's First Ultra-Thin Multiplayer Circuit Board", News Release, Nov. 1, 2004, 2 pages, submitted pages printed from http://www.epson.co.jp.
Butterfield, "The Print Shop: Sci-Fi Inkjet Printers" on-line article, Mar. 1, 2005, 2 pages, submitted pages printed from http://www.pcworld.com.
Canny et al., "Flexonics," Electrical Engineering and Computer Sciences, University of California, Berkeley, pp. 1-17, Dec. 14-17, 2002.

(Continued)

*Primary Examiner*—Paresh Patel
(74) *Attorney, Agent, or Firm*—Kirton & McConkie

(57) ABSTRACT

A probe substrate for use in testing semiconductor devices can include a base substrate that can have first electrical terminals at a first pitch. One or more redistribution layers on the base substrate can include droplets of a conductive material that form redistribution traces extending from the first terminals to second electrical terminals at a second pitch different from the first pitch.

29 Claims, 25 Drawing Sheets

OTHER PUBLICATIONS

Gay, "Direct Writing Global status and opportunities for the UK in advanced manufacturing," Crown, Feb. 2004, pp. i-vii and 1-1 through 6-1.
Graham-Rowe, "'Gadget printer' promises industrial revolution," New Scientist, 2 pages, Jan. 2003.
Lipson, "Homemade," IEEE Spectrum, pp. 24-31, May 2005.
Nozawa, "Epson Prints 20-Layer Board with Inkjet Technology" Feb. 2005, Nikkei Electronics Asia, Nikkei Business Publications, Inc., submitted pages printed from http://www.techhon.nikkeibp.co.jp.
Wohlers, "A Year Filled With Promising R&D," Time-Compression Technologies Magazine, 4 pages, Nov./Dec. 2002, Wohlers Associates.
Partridge, "Inkjets Enter Industrial Markets: What It Means For Screen Printers," Roland (Sep. 25, 2003).

* cited by examiner

PRINTING OF REDISTRIBUTION TRACES ON ELECTRONIC COMPONENT

BACKGROUND

The present invention is directed generally to fabricating redistribution traces on electronic components using droplets of different materials. Some embodiments of the invention can include the use of printing technology, such as ink printing technology, to deposit the droplets on an electronic component in selected patterns to form the redistribution traces as well as other elements.

Electronic components are often fabricated with a large number of input/output (I/O) terminals for signal transmission, power supply, ground (or bias), testing, etc. For example, semiconductor devices (e.g., semiconductor dies, which are also known as integrated circuits (ICs), can have conductive bond pads arrayed on the device's active surface, typically in one or more rows about the device periphery or across a central portion of the device. These bond pads are generally formed of aluminum or an aluminum alloy and are designed to be conductively connected to terminals of another electronic component such as a carrier substrate (e.g., a circuit board), the pattern of terminals on which may not correspond to the locations of the corresponding bond pads on the device. Redistribution traces can be used to relocate an array of I/O terminals of an electronic component. This is commonly done in flip-chip applications as well as other applications.

Making redistribution traces on an electronic component can require multiple deposition and etching steps. Expensive masks and other tools can also be required. Under-bump metallization (UBM) can also be required at the redistributed bond pad locations. Changes to the design and layout of the redistribution traces can require new masks and tools. Likewise, because different layouts, shapes, patterns, etc. of redistribution traces may be required for different electronic components, new masks and tools can be required for each new electronic component type on which redistribution traces are formed. In addition to the material and equipment costs associated with deposition and etching processes, such fabrication techniques can produce waste solutions that can require proper disposal and add to the overall cost.

It would be an advancement in the art to provide a method of fabricating redistribution traces on electronic components which in part avoids or minimizes multiple deposition and etching steps, expensive masks and other tools, and/or costly reagents and process waste. It would be a further advancement in the art to provide a method of fabricating redistribution traces that in part can use "soft" tools, such as tools that are configured by software or other programming means. Although the invention is not necessarily so limited, some embodiments of the invention can provide one or more of the foregoing advancements.

SUMMARY

In some embodiments, a probe substrate for use in testing semiconductor devices can include a base substrate that can have first electrical terminals at a first pitch. One or more redistribution layers on the base substrate can include droplets of a conductive material that form redistribution traces extending from the first terminals to second electrical terminals at a second pitch different from the first pitch.

In some embodiments, a probe card assembly for testing semiconductor devices can include a wiring substrate that can include a signal interface to a tester for testing the semiconductor devices. The probe card assembly can also include a probe substrate that includes first electrical terminals at a first pitch on a surface of the probe substrate. One or more redistribution layers can be disposed on the surface of the probe substrate. The redistribution layers can include droplets of a conductive material that form redistribution traces extending from the first terminals to second electrical terminals at a second pitch different from the first pitch on the surface of the probe substrate. Electrically conductive spring probes can be attached to the second terminals, and tips of the spring probes can be disposed in a pattern that corresponds to input and/or output terminals of the semiconductor devices to be tested. Electrical connections can connect the signal interface to the first terminals.

In some embodiments, a method of making a probe substrate can include providing a base substrate as a premanufactured component. The base substrate can include a pattern of first electrical terminals on a surface of the substrate. The method can also include receiving information regarding semiconductor devices to be tested. The information can include a pattern of input and/or output terminals of the semiconductor devices. The method can further include depositing droplets of one or more materials onto the substrate. The droplets can include electrically conductive droplets that form redistribution traces extending from the first terminals to second electrical terminals in a second pattern different than the first pattern on the surface of the substrate. The method can also include attaching electrically conductive spring probes to the second terminals. A pattern of contact tips of the conductive spring probes can be substantially the same as the pattern of input and/or output terminals of the semiconductor devices. The method can also include combining the base substrate with at least one other component to form the probe card assembly.

DETAILED DESCRIPTION OF EXEMPLARY EMBODIMENTS

Figure 1A:
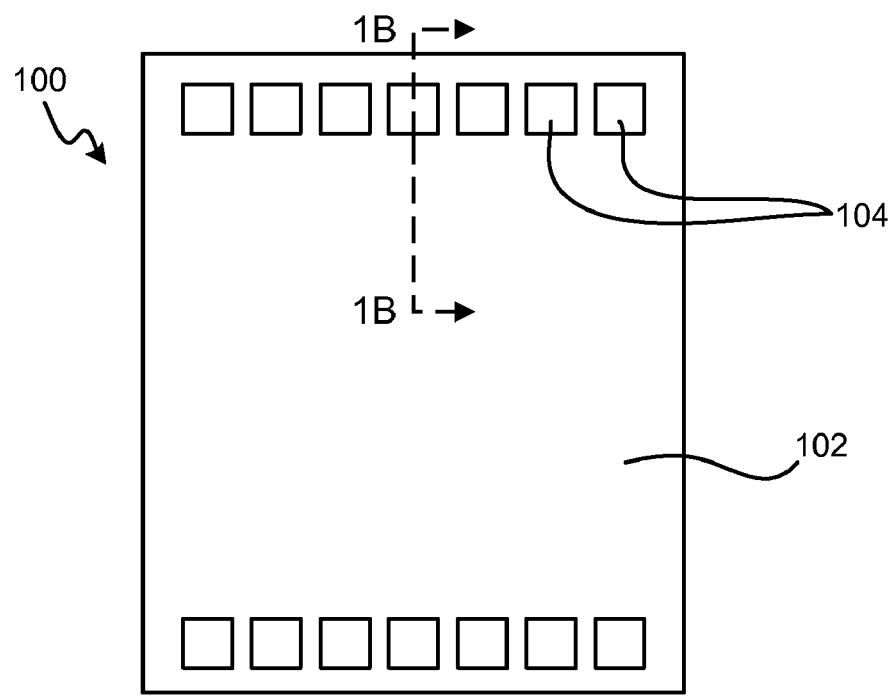
FIG. 1A is a top view of a representative substrate and plurality of terminals according to some embodiments of the invention.
Figure 1B:
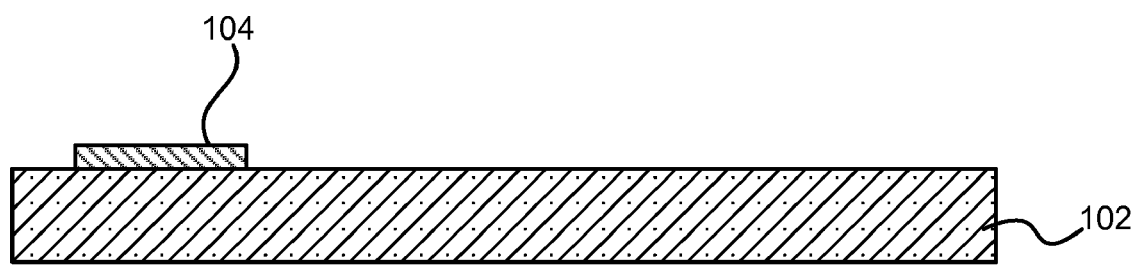
FIG. 1B is a side cross-sectional view of FIG. 1A.

This specification describes exemplary embodiments and applications of the invention. The invention, however, is not limited to these exemplary embodiments and applications or to the manner in which the exemplary embodiments and applications operate or are described herein. Moreover, the Figures can show simplified or partial views, and the dimensions of elements in the Figures can be exaggerated or otherwise not in proportion for clarity. In addition, as the terms "on" and "attached to" are used herein, one object (e.g., a material, a layer, a substrate, etc.) can be "on" or "attached to" another object regardless of whether the one object is directly on or attached to the other object or there are one or more intervening objects between the one object and the other object. Also, directions (e.g., above, below, top, bottom, side, up, down, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

FIGS. 1A-7B illustrate an exemplary process of forming redistribution traces on an electronic component 100 according to some embodiments of the invention. The electronic component can include a substrate 102 (which can be a non-limiting example of a base substrate or a probe substrate) and a plurality of electrical terminals 104 (which can be non-limiting examples of first terminals in a first pitch or first pattern). Substrate 102 can comprise any substrate suitable for supporting terminals 104. For example, substrate 102 can be a printed circuit board. As another example, substrate 102 can comprise ceramic. Although not shown in FIGS. 1A and 1B, terminals 104 can be electrically connected to another electronic component (not shown), circuit (not shown), or another terminal (not shown) on or in substrate 102, which can comprise materials such as wiring board material, a ceramic material, an organic material, etc. In some embodiments, substrate 102 can be a semiconductor die, which can be a die singulated from the semiconductor wafer on which the die was made. Alternatively, substrate 102 can be an unsingulated die. That is, substrate 102 can be one of many dies on a semiconductor wafer that have not yet been singulated from the wafer. In such a case, the process illustrated in FIGS. 1A-7B can be performed on one, many, or all of the dies of the wafer. Substrate 102 can comprise other types of electronic components such as a printed circuit board. Regardless of whether substrate 102 is a die or another type of electronic component, by example and not limitation, the terminals 104 can be bond pads formed of aluminum or an aluminum alloy. Such aluminum bond pads can have an electrically non-conductive aluminum oxide (or oxidation) coating.

Figure 2A:
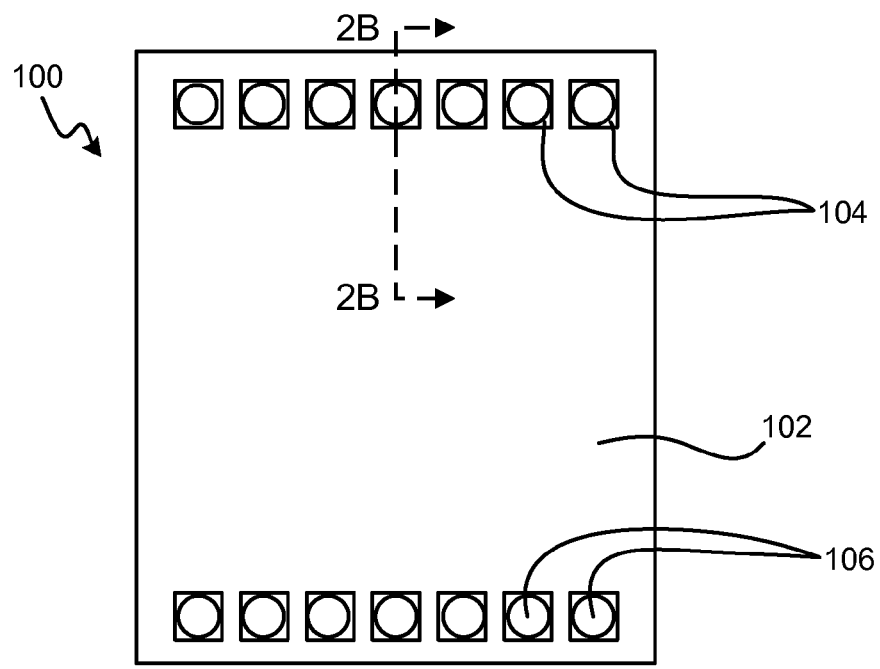
FIG. 2A is a top view of the representative substrate of FIG. 1A with electrically conductive connectors attached to the terminals according to some embodiments of the invention.
Figure 2B:
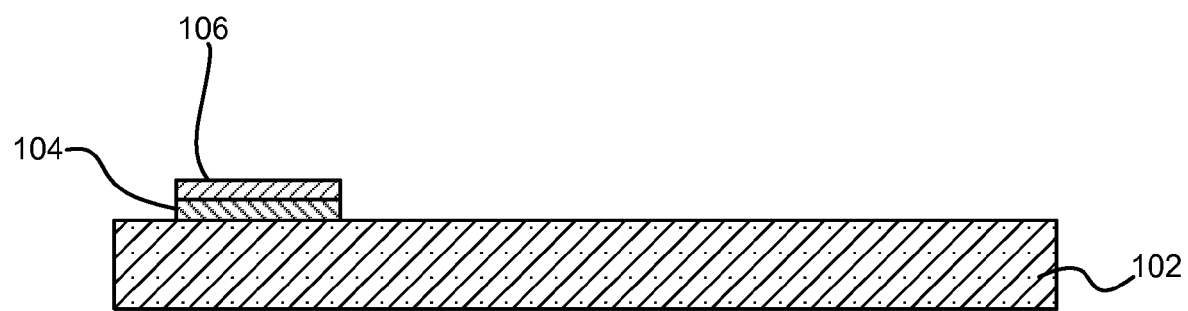
FIG. 2B is a side cross-sectional view of FIG. 2A.

Referring to FIGS. 2A and 2B, the process can include forming electrically conductive connectors 106 attached to the terminals 104. Such connectors 106 can provide an electrical connection to the terminals 104. For example, the connectors 106 can pierce or penetrate oxide (or oxidation) or other electrically non-conductive build-up or debris on terminals 104 and thereby establish an electrical connection with the terminals 104. The connectors 106 can be, but are not limited to, a wire bump comprising gold or copper. This can be efficiently accomplished using a wire bonding machine, for example, such as are used to bond wires to semiconductor dies. For example, one end of a wire can be bonded to a terminal 104 using standard wire bonding techniques such as are known. The bonding of the wire to the terminal 104 can cause the wire to break through any oxide (or oxidation) or other debris (e.g., non-electrically conductive debris) on a surface of the terminal 104 and thereby form an electrical connection between the wire and the terminal 104. For example, a layer of non-conductive oxide (or oxidation) typically forms on a surface of aluminum terminals 104. The wire can then be severed close to the bond, forming a wire bump attached and electrically connected to the terminal 104.

As shown in FIGS. 3A-5B, the process can include depositing an array (which can comprise regular or irregular patterns) of droplets on substrate 102, and the droplets can comprise different materials so that different types of droplets in the array have different properties and can perform different functions in the array. For purposes of illustration and ease of discussion, in FIGS. 3A-5B, at least two types of droplets each made of different materials can form the array of droplets. In other implementations of the process, however, fewer or more types of droplets made of different materials can be used to create an array. Thus, arrays made of one type of droplet, two types of droplets, three types of droplets, four types of droplets, etc. can be formed. Nevertheless, before discussing the details of the non-limiting, exemplary process of forming redistribution traces, a brief discussion of the properties and functions of the exemplary types of droplets and exemplary means for depositing the droplets are provided.

The first type of droplets 108 (examples of which are filled with slanted lines and thus have a dark grey appearance throughout FIGS. 3B-7B) can form an electrically non-conductive layer on a substrate 102. (As used herein, droplets or a layer can be "on" substrate 102 if the droplets or layer is directly deposited onto a surface of substrate 102. As used herein, droplets or a layer can also be "on" substrate 102 if the droplets or layer is deposited directly onto other droplets or another layer or layers that are directly on a surface of substrate 102 or are on still other droplets or still another layer or layers that are on a surface of the substrate 102.) The first material, which forms the first type of droplets 108, can be a generally non-conductive material (e.g., droplets 108 can comprise one or more dielectric materials). Examples of suitable materials for the first type of droplets include, without limitation, polymers, polyphenylene sulfides, polyimides, polyetherimides, polyether-etherketones, epoxy resins, polyetones, and mixtures of or materials containing the foregoing. A material marketed under the trade name FullCure M-720 by Objet Geometries, Ltd. of Rehovot, Israel is also a suitable material for the droplets 108. First type of droplets 108 can be non-limiting examples of droplets of a non-conductive material.

The second type of droplets 110 (examples of which are filled black throughout FIGS. 4B-7B) can form an electrically conductive layer on a substrate. The second material, which forms the second type of droplets 110, can be a conductive material. Examples of suitable materials for the second type of droplets include, without limitation, any electrically conductive fluid that can be deposited on top of previous layers of droplets, including, without limitation, polyaniline, polythiophene, and mixtures of or materials containing the foregoing. A conductive ink marketed under the trade name NanoPaste by Harima Chemical, Inc. of Japan or Harimatec, Inc. of Duluth, Calif. can be used as a material for the second type of droplets. Other non-limiting examples of materials suitable for the conductive type of droplets include, without limitation, polymers (e.g., epoxies, silicones, etc.) containing metal pieces or particles. Second type of droplets 110 can be non-limiting examples of droplets of a conductive material. Layers 112 and 118 and redistribution traces 114 can be non-limiting examples of redistribution layers.

Figure 9:
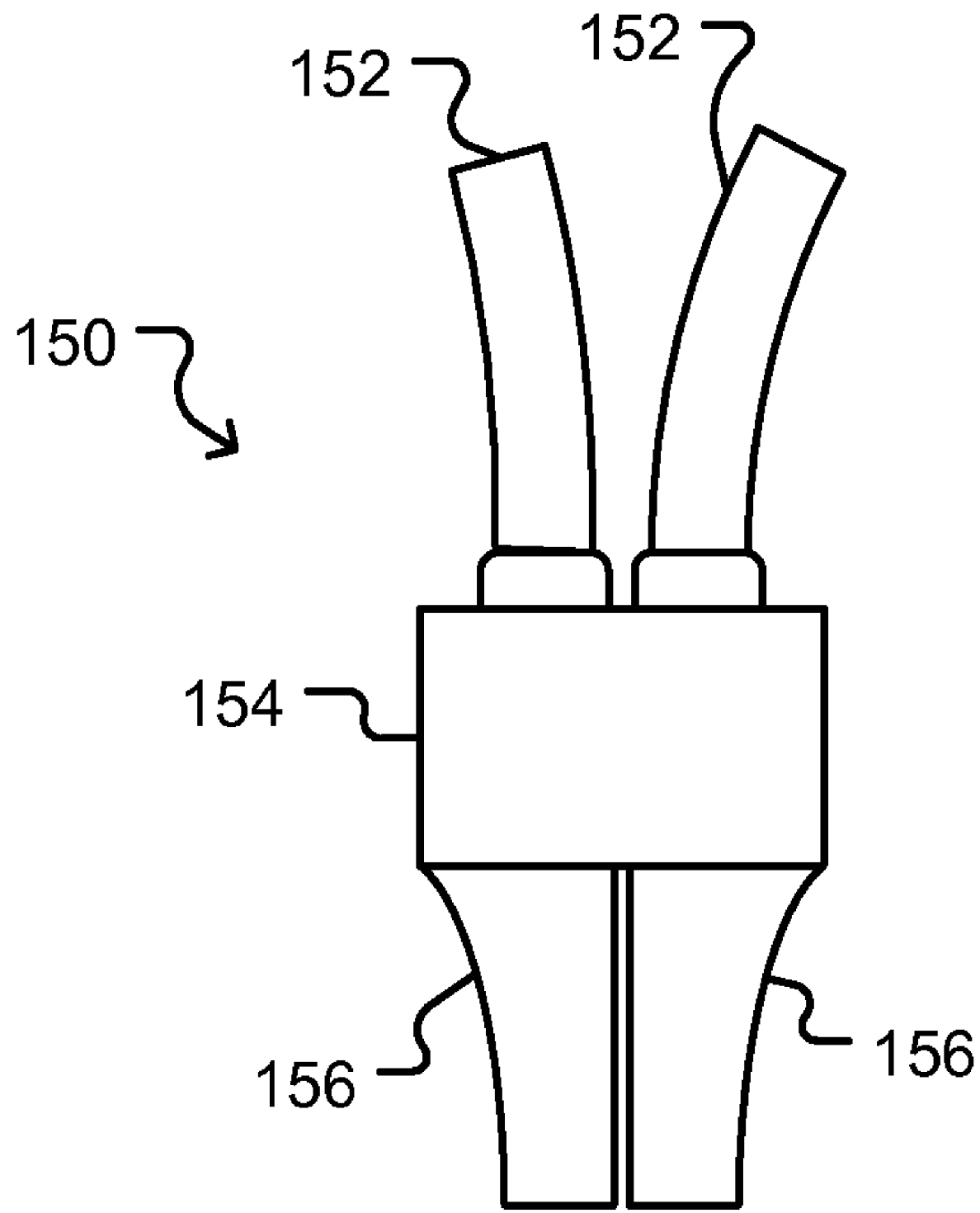
FIG. 9 illustrates a representative spray head for applying droplets to a substrate in accordance with some embodiments of the invention.
Figure 10:
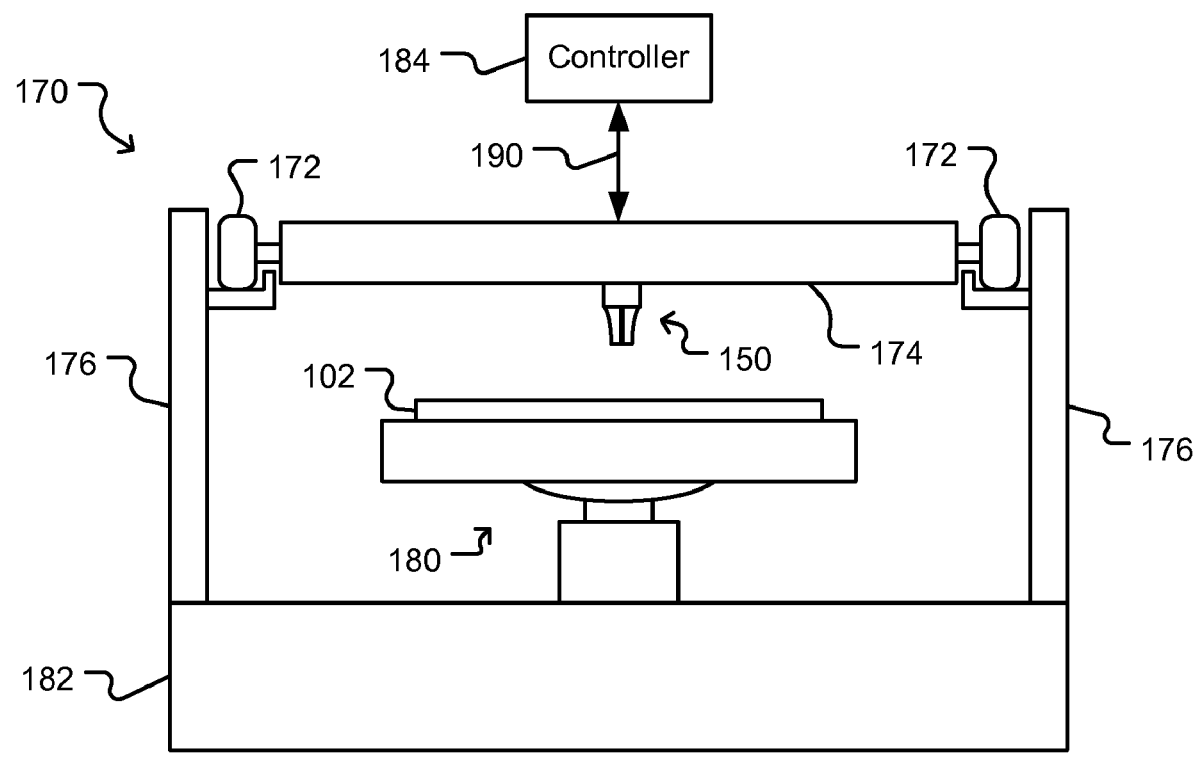
FIG. 10 illustrates a representative system for applying droplets to a substrate in accordance with some embodiments of the invention.

Droplets 108 and/or 110 can be deposited on substrate 102 in any manner suitable for depositing droplets of different materials in a two-dimensional or three-dimensional array. For example, droppers (not shown) can be used to deposit the droplets 108, 110 in the pattern shown in FIGS. 3A-7B. FIGS. 9 and 10 illustrate another non-limiting example in which an automated spray head 150 can be used to deposit droplets 108, 110.

FIG. 9 illustrates an exemplary spray head 150 that can apply droplets onto a substrate in accordance with some embodiments of the invention. Spray head 150 can be, for example, an inkjet print head or other type of print head. In FIG. 9, spray head 150 can include connectors 152 that provide one or more materials from one or more corresponding sources (not shown) to body 154. Individual corresponding droplets can be selectively dispensed from spray head 150 at dispensers 156. In some embodiments of the invention, each dispenser 156 can dispense droplets of a different material. That is, each dispenser 156 can dispense a different type of droplet. Although spray head 150 is depicted in FIG. 9 (and also FIG. 10) as having two dispensers 156, spray head 150 can alternatively have only one dispenser 156, or spray head 150 can have more than two dispensers 156.

In FIG. 10 a representative system 170 for applying droplets to substrate 102 in accordance with some embodiments of the invention is illustrated. In FIG. 10, system 170 can comprise spray head 150 that can be moved in a plurality of directions. For example, rollers 172 can allow spray head 150 to be moved in directions corresponding to into and out of the page in FIG. 10. Moreover, spray head 150 can be attached to support mechanism 174 such that spray head 150 can move horizontally and/or vertically in FIG. 10. The support mechanism 174 can also be configured to allow other movements of spray head 150, such as tilting or rotating spray head 150. A chuck 180 or other holding mechanism can hold substrate 102, and chuck 180 can be moveable. By moving one or both of spray head 150 and/or substrate 102 (e.g., by moving chuck 180), droplets 108, 110 can be selectively deposited on substrate 102 through spray head 150 in patterns like those shown herein to form redistribution traces 114 as generally shown in FIGS. 3A-8B. A controller 184 can control movement of spray head 150 and chuck 180 and can control the dispensing of droplets from spray head 150. Controller 184 can be, for example, a digital controller, such as a computer or other programmable device, and controller 184 can control spray head 150 and chuck 180 by outputting control signals 190. Controller 184 can cause spray head 150 to dispense any suitable pattern of droplets onto substrate 102. Moreover, as different substrates 102 are placed on chuck 180, controller 184 can cause spray head 150 to deposit different patterns of droplets on each of the substrates 102. Although one spray head 150 is shown in the system 170 of FIG. 10, multiple such spray heads can be included in system 170 and independently controlled to deposit droplets of material on substrate 102.

Figure 3A:
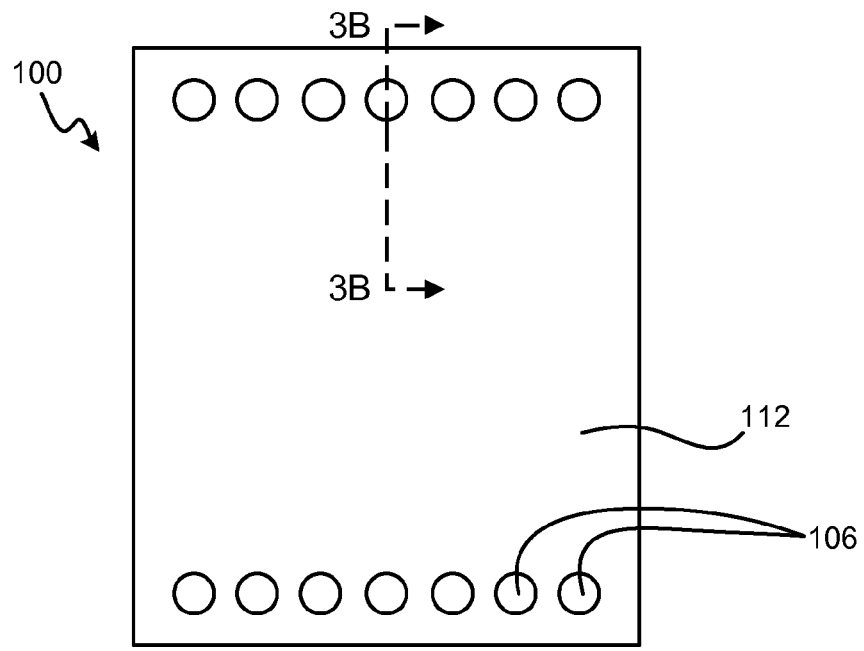
FIG. 3A is a top view of the representative substrate of FIG. 2A with droplets of a non-conductive material disposed on the substrate according to some embodiments of the invention.
Figure 3B:
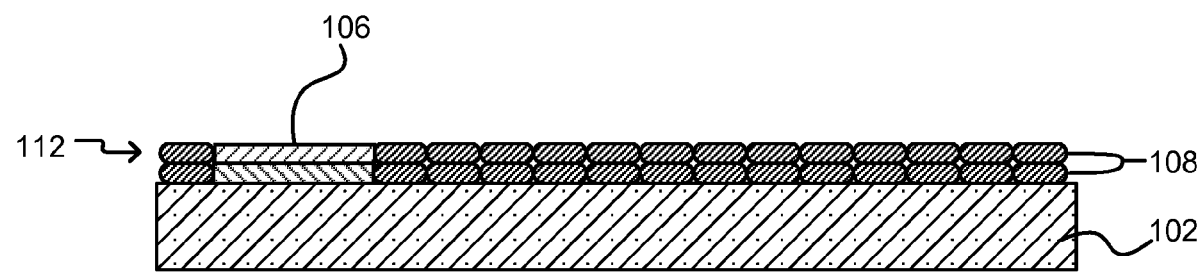
FIG. 3B is a side cross-sectional view of FIG. 3A.

Referring again to the process illustrated in FIGS. 1A-8B and specifically to FIGS. 3A and 3B, a plurality of the first type of droplets 108 can be deposited on the substrate 102 to form a first non-conductive layer 112. (Although for ease of illustration layer 112 is shown as comprising two layers of droplets 108, layer 112 can comprise many layers of droplets 108.) The first non-conductive layer 112 can be formed using any of the deposition techniques disclosed above, including but not limited to, use of spray head 150. While FIG. 3A shows the first non-conductive layer 112 covering substantially the entire substrate surface, the first non-conductive layer 112 can be deposited only at predetermined areas. In one non-limiting example, the first non-conductive layer 112 can be deposited around the electrically conductive connectors 106, while maintaining the connectors 106 at least partially exposed. For example, the first non-conductive layer 112 can include openings that expose at least part of connectors 106. In another non-limiting example, the non-conductive layer 112 can be deposited in a pattern that corresponds to the size and shape of the redistribution traces to be formed. By limiting the size and extent of the layer 112, device throughput can be increased and material costs can be decreased.

Figure 4A:
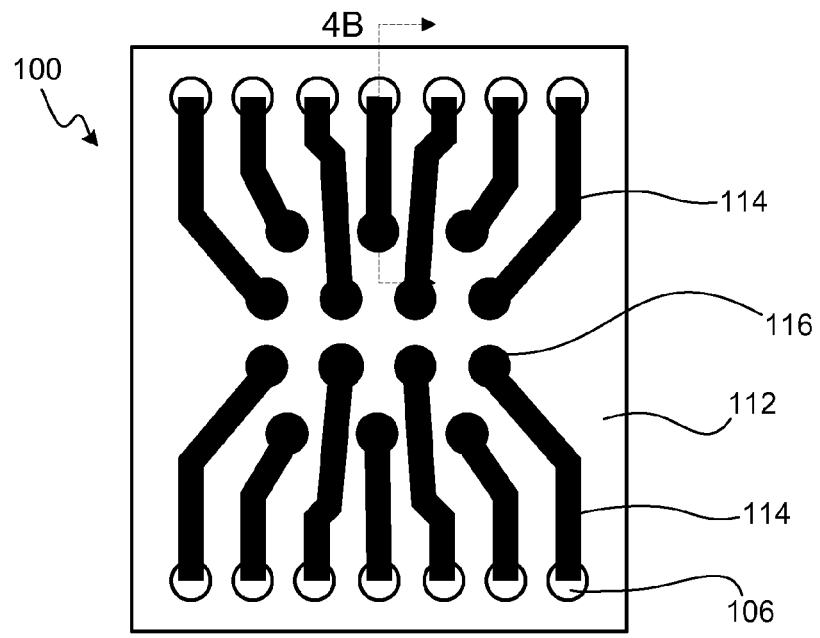
FIG. 4A is a top view of the representative substrate of FIG. 3A with droplets of a conductive material forming redistribution traces disposed on the substrate according to some embodiments of the invention.
Figure 4B:
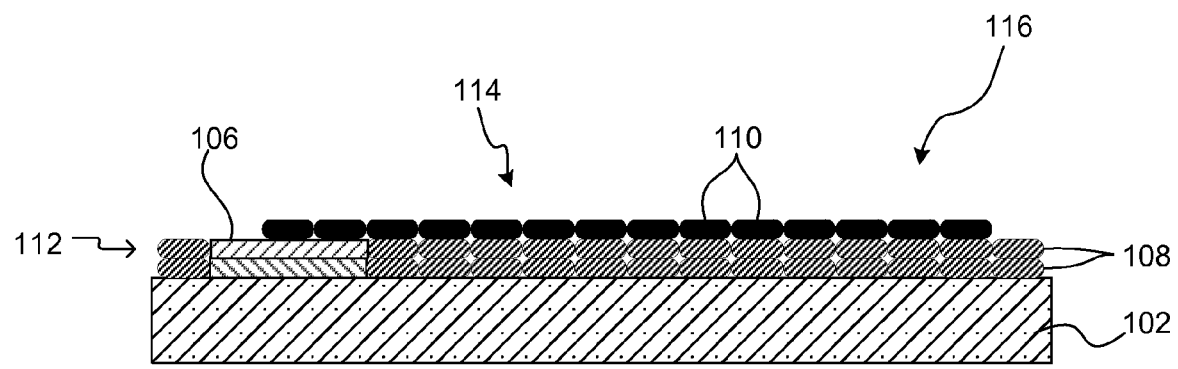
FIG. 4B is a side cross-sectional view of FIG. 4A.

FIGS. 4A and 4B illustrate a plurality of the second type of droplets 110 of conductive material deposited on the substrate 102 to form a plurality of redistribution traces 114. (Although for ease of illustration traces 114 are illustrated as comprising one layer of droplets 110, traces 114 can comprise many layers of droplets 110.) The redistribution traces 114 can extend from the exposed electrically conductive connectors 106 to opposite ends 116 of the redistribution traces 114. Opposite ends 116 can function as terminals and can be non-limiting examples of second terminals in a second pitch or second pattern.

Figure 5A:
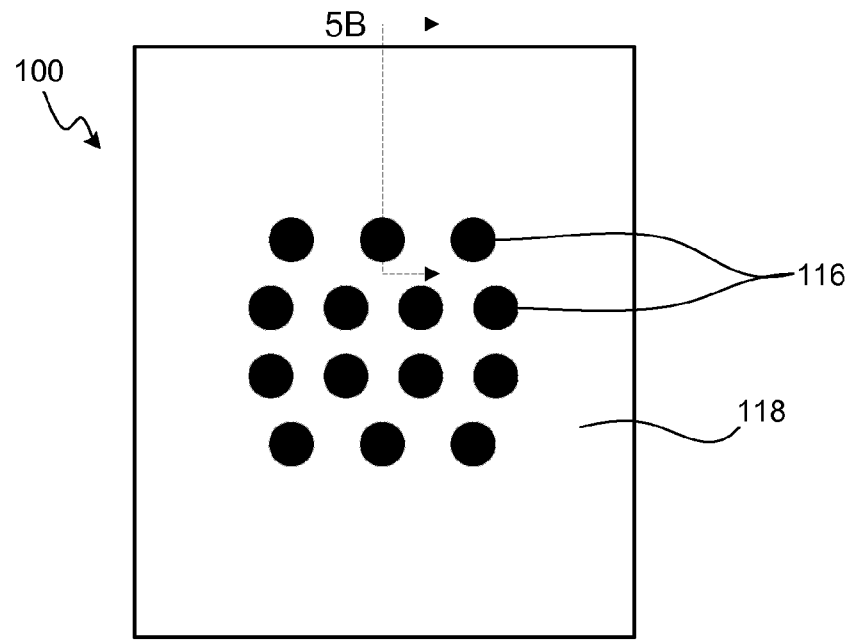
FIG. 5A is a top view of the representative substrate of FIG. 4A with droplets of non-conductive material disposed on the substrate according to some embodiments of the invention.
Figure 5B:
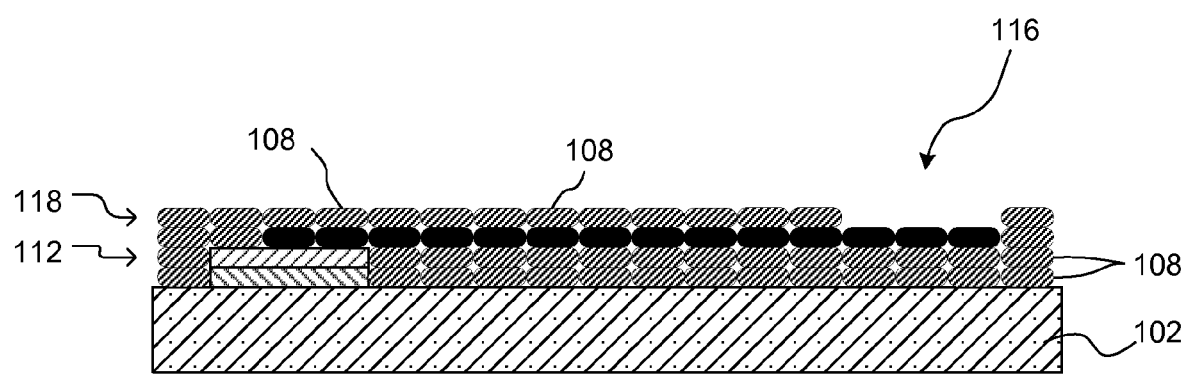
FIG. 5B is a side cross-sectional view of FIG. 5A.

Additional droplets 108 of non-conductive material can optionally be deposited on the substrate 102 to form a second non-conductive layer 118, as illustrated in FIGS. 5A and 5B. In one non-limiting example, the second non-conductive layer 118 is not deposited on the opposite ends 116 of the redistribution traces 114 such that the opposite ends 116 remain exposed. In another non-limiting example, the second non-conductive layer 118 can be deposited over the redistribution traces 114 but over less than all of the substrate 102. In another non-limiting example, the second non-conductive layer 118 can be deposited over the electrically conductive connectors 106. In yet another non-limiting example, the additional droplets 108 that form the second non-conductive layer 118 can be deposited over substantially all of the substrate 102.

Figure 6A:
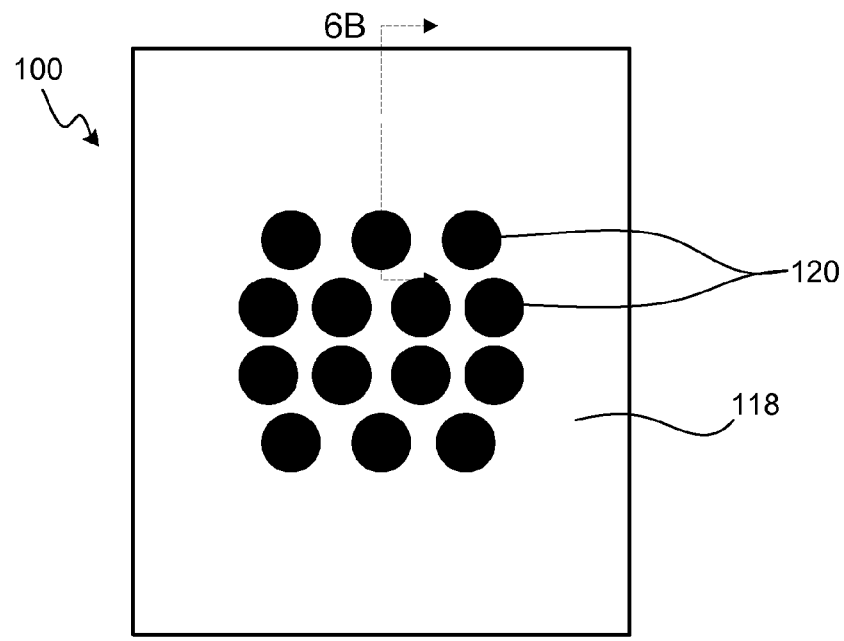
FIG. 6A is a top view of the representative substrate of FIG. 5A with electrical contact structures formed at the opposite ends of the redistribution traces according to some embodiments of the invention.
Figure 6B:
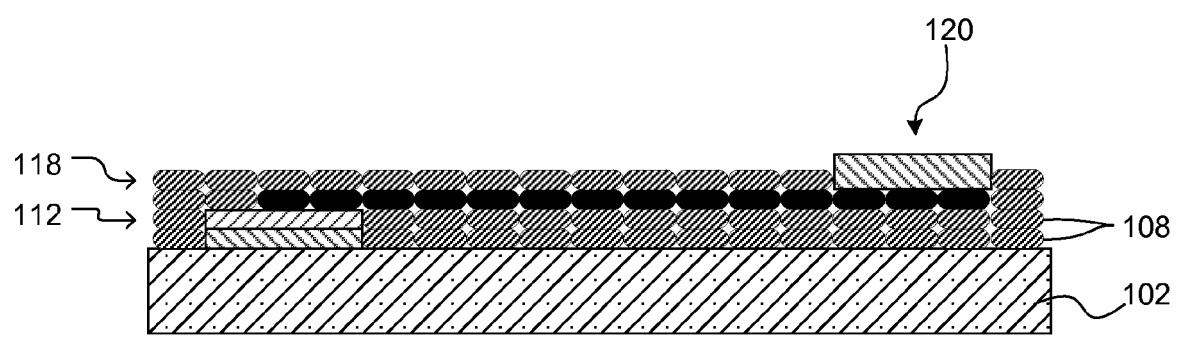
FIG. 6B is a side cross-sectional view of FIG. 6A.
Figure 7A:
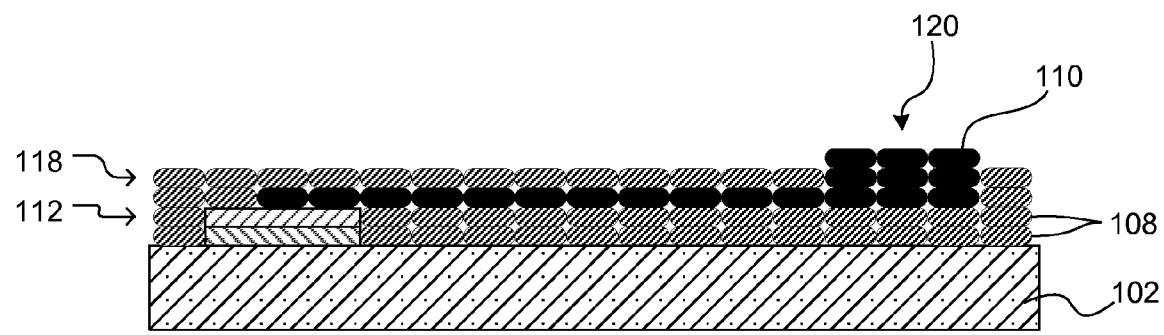
FIG. 7A is a side cross-sectional view similar to FIG. 6A, except that the electrical contact structures can be formed from droplets of conductive material according to some embodiments of the invention.
Figure 7B:
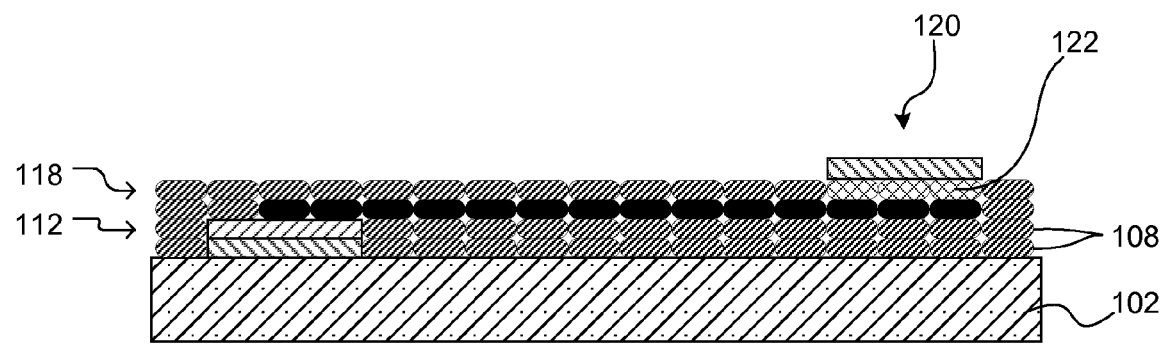
FIG. 7B is a side cross-sectional view similar to FIG. 6A, except that the electrical contact structures can be formed by disposing the contact structure on adhesive.

The process can include forming electrical contact structures 120 at the opposite ends 116 of the redistribution traces 114, as illustrated in FIGS. 6A and 6B. The contact structures 120 can include, but are not limited to, solder bumps or solder balls formed by known or novel processes including, but not limited to, evaporation, electroplating, printing, jetting, stud bumping, and direct placement. In a non-limiting example, the electrical contact structures 120 can be formed of droplets 110 (e.g., additional droplets) of conductive material deposited on the opposite ends 116 of the redistribution traces 114, as shown in FIG. 7A. In another non-limiting example, the electrical contact structures 120 can be formed by depositing conductive adhesive 122 at the opposite ends 116 of the redistribution traces 114 and affixing contact structures 120 on the adhesive 122, as shown in FIG. 7B. The adhesive can be deposited using various known or novel techniques including, but not limited to, printing (e.g., using an ink jet print head or other type of print head), stenciling, or depositing with a pattern or mask.

Figure 8A:
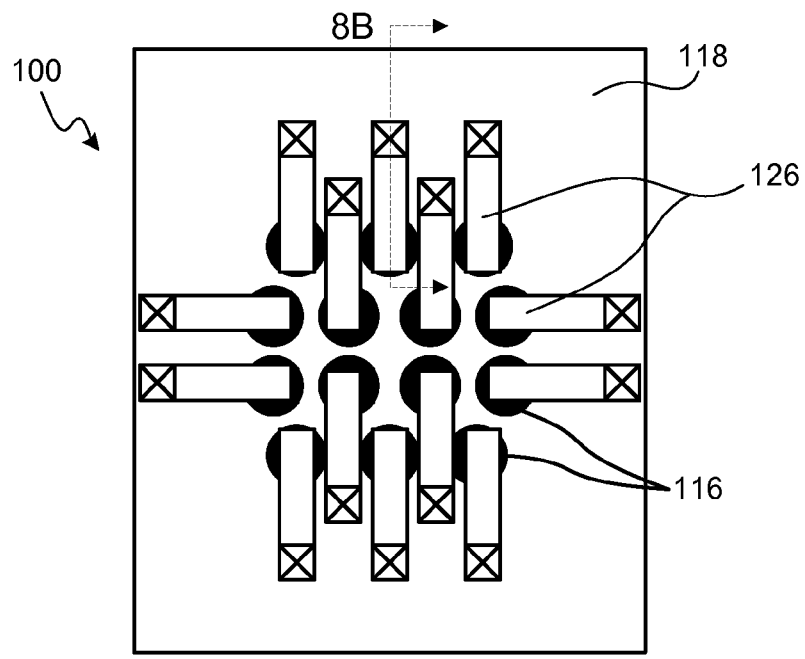
FIG. 8A is a top view of the representative substrate of FIG. 5A in which the contact structures are spring probes according to some embodiments of the invention.
Figure 8B:
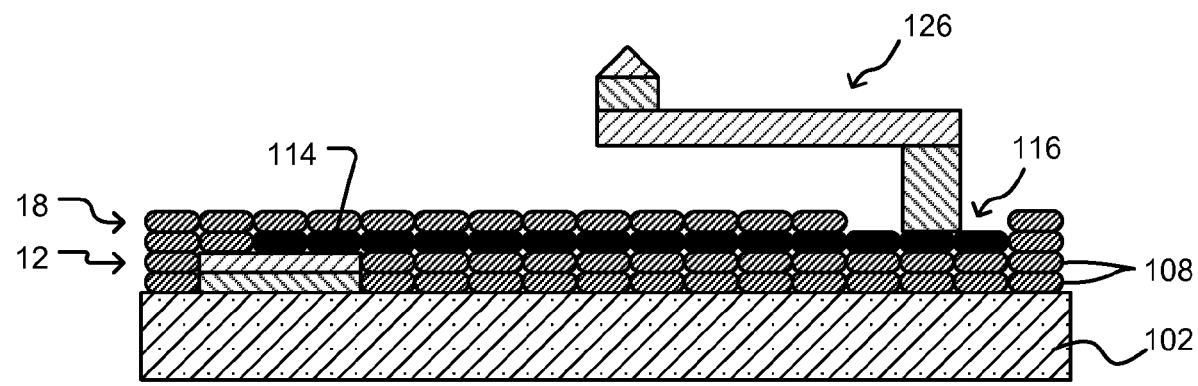
FIG. 8B is a side cross-sectional view of FIG. 8A.

FIGS. 8A and 8B illustrate an example in which contact structures 120 can be resilient conductive structures or spring probes 126. Non-limiting examples of suitable spring probes 126 (hereinafter referred to as probes) include composite structures formed of a core wire over coated with a resilient material as described in U.S. Pat. Nos. 5,476,211, 5,917,707, and 6,336,269. The probes 126 can alternatively be lithographically formed structures, such as the spring elements disclosed in U.S. Pat. Nos. 5,994,152, 6,033,935, 6,255,126, 6,945,827, U.S. Patent Application Publication No. 2001/0044225, and U.S. Patent Application Publication No. 152/0016119. Still other non-limiting examples of probes 126 are disclosed in U.S. Pat. Nos. 6,827,584, 6,640,432, 6,441,315, and U.S. Patent Application Publication No. 2001/0012739. Probes 126 can be suitable for effecting reliable pressure connections with terminals of semiconductor devices (e.g., dies) by being sufficiently strong, resilient, and robust to make repeated pressure based electrical connections with the terminals and carry sufficient current to test the semiconductor devices. Contact structures 120 need not, however, be probes but can be many other types of structures. Other non-limiting examples of contact structures 120 include conductive pogo pins, bumps, studs, stamped springs, needles, buckling beams, etc.

Figure 8C:
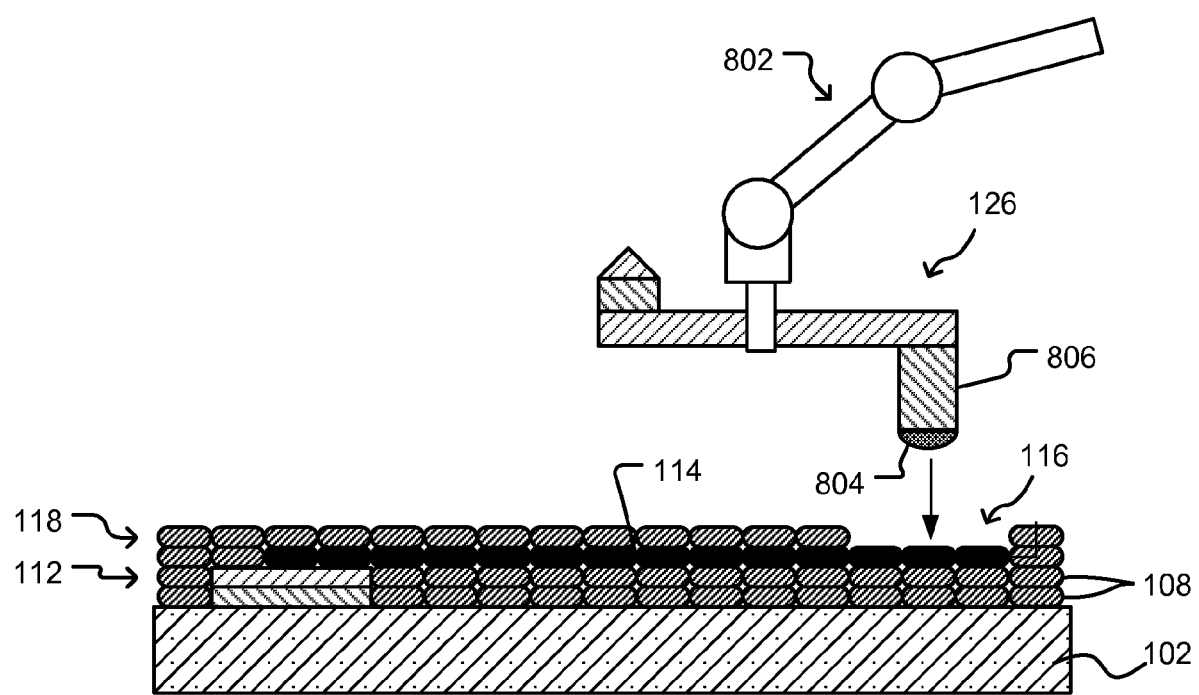
FIGS. 8C and 8D illustrate use of a pick-and-place machine to position the spring probes according to some embodiments of the invention.
Figure 8D:
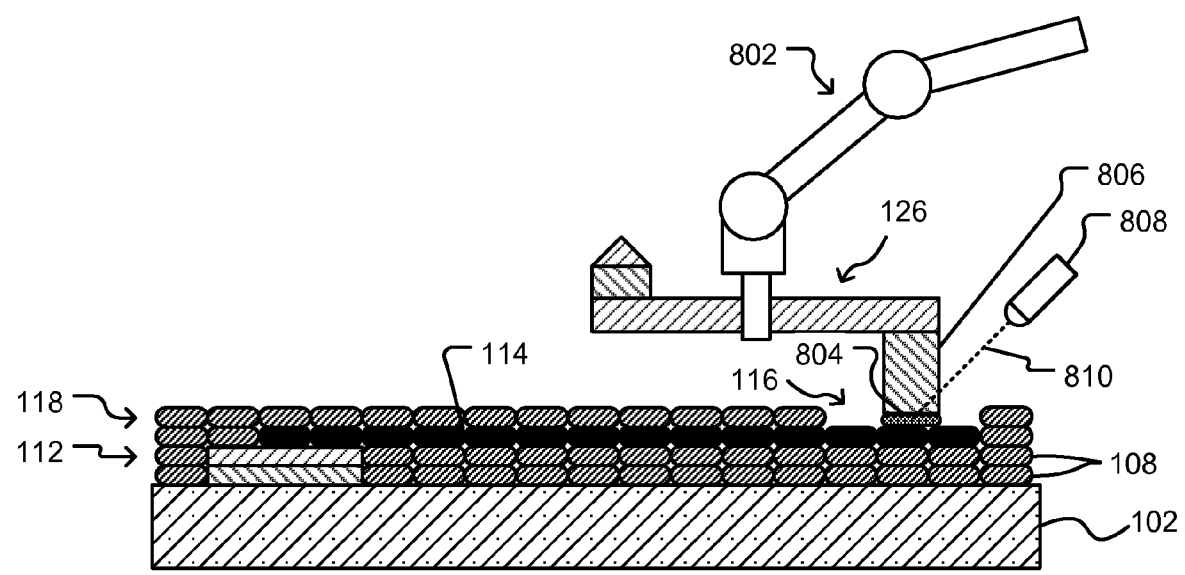

A probe 126 can be attached to an end 116 of a trace 114 in any suitable manner. FIGS. 8C and 8D illustrate a non-limiting example in which a pick-and-place machine 802 grasps a loose probe 126 and positions a base of a probe 126 at an end 116 of a trace 114 according to some embodiments of the invention. As shown, a joining material 804 (e.g., solder or a conductive adhesive) can be provided on the base 806 for adhering the base 806 to the end 116 of the trace 114. Optionally, a mechanism 808 (see FIG. 8D) can activate the joining material 804. For example, the mechanism 808 can be a laser and can generate a laser beam 810 that, for example, temporarily melts, and thus activates, the joining material 804. For example, the laser beam 810 can melt joining material 804 comprising solder.

Figure 8E:
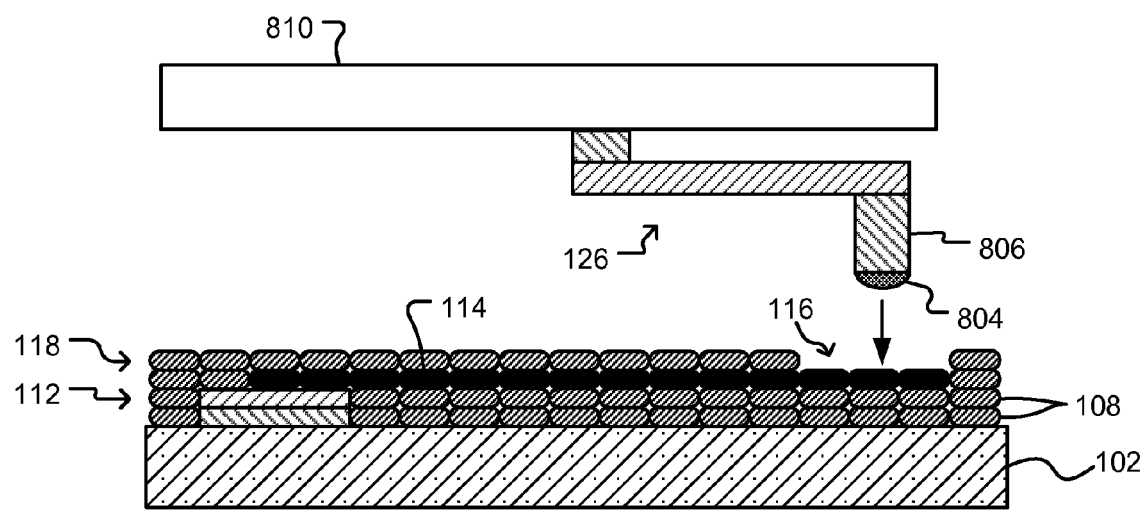
FIGS. 8E and 8F illustrate transferring the spring probes from a sacrificial substrate to the redistribution traces according to some embodiments of the invention.
Figure 8F:
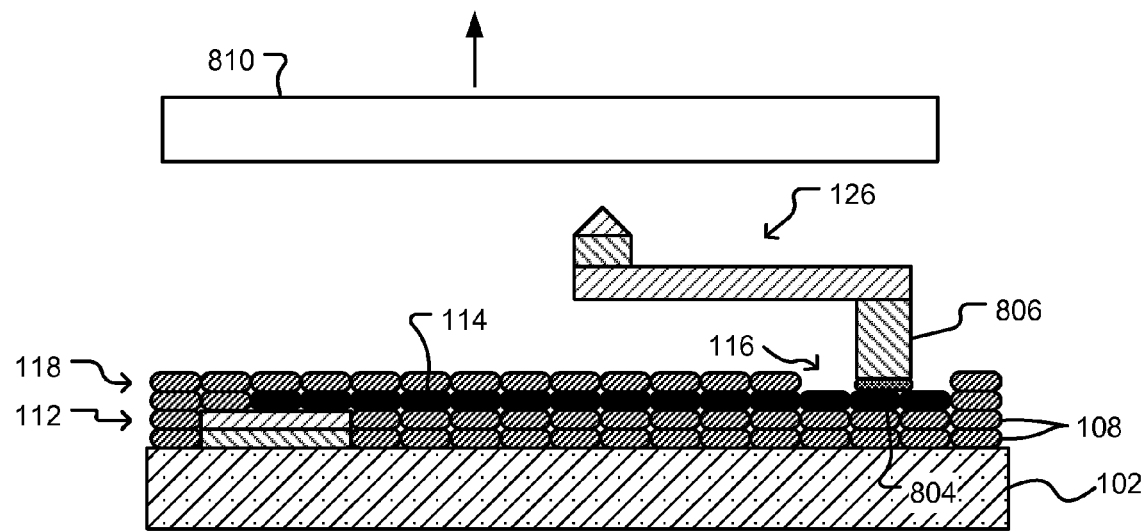

FIGS. 8E and 8F illustrate another example of a suitable way of attaching a probe 126 to an end 116 of a trace 114 according to some embodiments of the invention. The probe 126 can be made on a sacrificial substrate 810. (Although one probe 126 is shown, many can be made on the sacrificial substrate 810 and attached to ends 116 of many traces 114.) While the probe 126 is attached to the sacrificial substrate 810, the sacrificial substrate 810 can be positioned such that the base 806 of the probe 126 is positioned at an end 116 of the trace 114. As discussed above with respect to FIGS. 8C and 8D, joining material 804 can adhere the base 806 to the end 116 of the trace 114. The probe 126 can then be released from the sacrificial substrate 810, which can then be removed. A mechanism like 808 of FIG. 8D can be used, as discussed above, to activate the joining material 804.

Figure 8G:
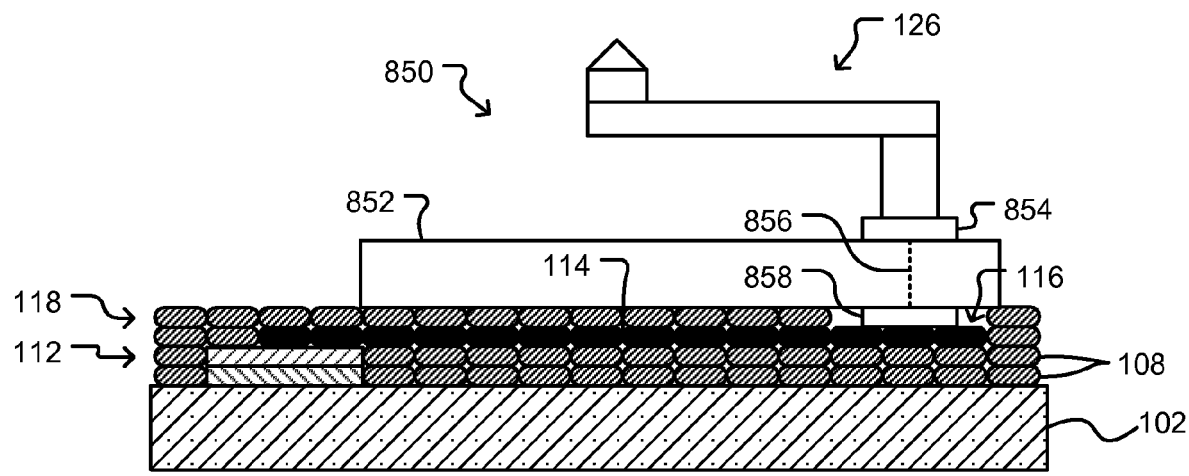
FIG. 8G illustrates a tile assembly connected to the redistribution traces according to some embodiments of the invention.

FIG. 8G illustrates an example in which a tile assembly is connected to an end 116 of a trace 114 according to some embodiments of the invention. As shown, a tile assembly 850 can include a substrate 852 (e.g., a printed circuit board, a semiconductor substrate, a ceramic substrate, or any structure suitable for supporting probes 126), which can be an example of a second substrate. The substrate 852 can include a terminal 854 on one side and a terminal 858 on another side. (The terminal 854 can be an example of a third terminal on a first surface of substrate 852, and the terminal 858 can be an example of a fourth terminal on a second surface of the substrate 852.) An electrical connection 856 can be provided through the substrate 852 to electrically connect the terminal 854 on the one side with the terminal 858 on the other side of the substrate. As shown in FIG. 8G, a terminal 858 can be connected to an end 116 of a trace 114. Although one probe 126 is shown in FIG. 8G, multiple probes 126 can be attached to multiple terminals 854 on the one side of the substrate 852, and each of the terminals 854 can be electrically connected by a connection 856 to a corresponding terminal 858 on the other side of the substrate 852. In some embodiments, a plurality of tile assemblies 850 can be attached to ends 116 of the traces 114 and thus to substrate 102.

Returning to the discussion of contact structures 120 in FIGS. 7A and 7B, in some embodiments, the contact structures 120 can be formed by depositing a plurality of droplets comprising different materials in a three-dimensional array such as the contact structures disclosed in U.S. patent application Ser. No. 11/306,291, filed Dec. 21, 2005, which application and disclosure are incorporated by reference. The contact structures can be formed by depositing multiple layers of conductive and non-conductive droplets to form a three-dimensional array comprising a support structure and a conductive seed layer on the support structure. A structure material can be electrodeposited onto the seed layer to create the contact structures. In other embodiments, contact structures 120 can be made on the opposite ends 116 of the traces 114 using other processes. In still other embodiments, contact structures 120 can be made in a separate process (e.g., on a substrate other than substrate 102) and then attached to the opposite ends 116 of the traces 114.

Figure 11A:
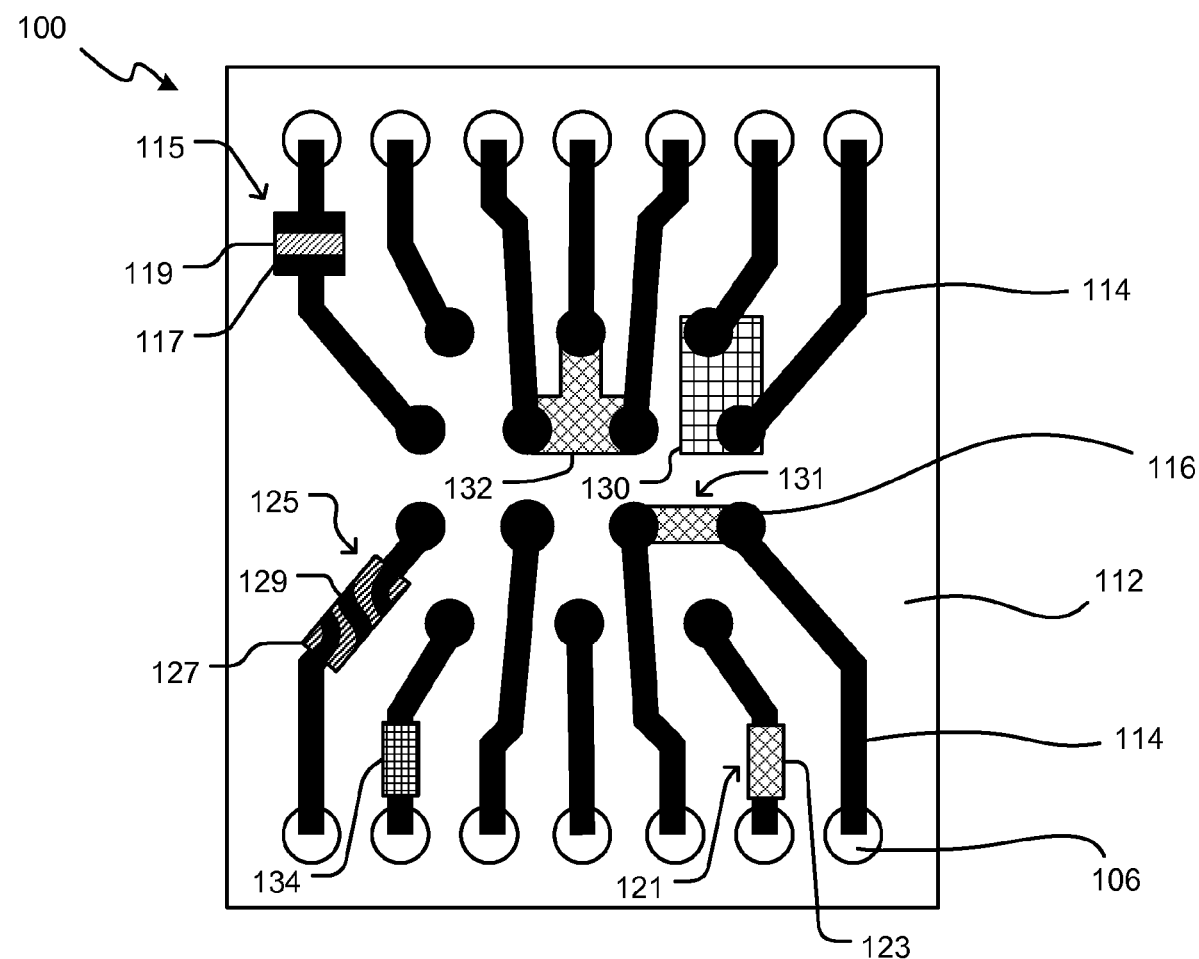
FIG. 11A shows the electronic device of FIG. 5A with exemplary electronic elements or circuits according to some embodiments of the invention.

The processes and techniques disclosed herein can be used to deposit droplets of conductive, non-conductive, or other materials to form electronic elements in two- and/or three-dimensional arrays. Examples of such electronic elements can include, but are not limited to, a resistor, a capacitor, an inductor, a diode, a transistor, and/or a complex circuit comprising two or more of such electronic elements. For example, as shown in FIG. 11A, a resistor 121 can be formed in one or more of the redistribution traces 114 by, for example, depositing droplets 123 comprising an electrically resistive material that forms part of a trace 114 between a connector 106 and an opposite end 116. Such droplets 123 can comprise a material selected to have a desired electrical resistance. For example, the material can have an electrical resistance that corresponds to a desired resistance level of the resistor 121 (or resistor 131) (e.g., 100 ohms, 1000 ohms, 10,000 ohms, etc.). As another alternative, such droplets can be deposited between two traces 114 forming a resistor 131 electrically connected between two of the redistribution traces 114 as also shown in FIG. 11A. As yet another alternative, resistor 121 can be electrically connected from one trace 114 to another electrical entity such as a connection to ground.

A capacitor can similarly be formed in one or more of the traces 114 or between ones of the traces 114. For example, as shown schematically in FIG. 11A, a capacitor 115 can be made by depositing droplets forming electrically conductive plates 117 and droplets forming a dielectrical material 119 (e.g., a material with a high "K" value such as tantalum oxide filled epoxy or a similar material) between the plates 117. As also shown in FIG. 11A, a portion of the trace 114 corresponding to connector 106 can be electrically connected to one of the plates 117 and a portion of the trace 114 corresponding to an opposite end 116 can be electrically connected to another of the plates 117. Alternatively, although not shown, one trace 114 can be electrically connected to one of the plates 117 and another trace 114 can be electrically connected to the other of the plates 117 so that the capacitor is electrically connected between two traces 114 (e.g., generally like resistor 131). As yet another alternative, capacitor 115 can be electrically connected from one trace 114 to another electrical entity such as a connection to ground.

An inductor can similarly be formed within a trace 114 by depositing conductive and nonconductive droplets. FIG. 11A illustrates a non-limiting example of such an inductor 125, which can comprise electrically conductive droplets deposited to form a coil structure 129 and non-conductive droplets 127. In some embodiments, droplets 127 can include iron oxide or a similar material to increase or improve the inductance of the inductor 125. As shown in FIG. 11A, inductor 125 can be part of a trace 114 such that a portion of the trace 114 corresponding to a connector 106 can be electrically connected to one end of the inductor 125 and a portion of the trace corresponding to an opposite end 116 can be electrically connected to another end of the inductor 125. Alternatively, one end of such an inductor 125 can be electrically connected between two traces 114 (e.g., generally like resistor 131). As yet another alternative, inductor 125 can be electrically connected from one trace 114 to another electrical entity such as a connection to ground.

A transistor 132 can similarly be formed between three of the traces 114 or as part of a trace 114 and connected to another trace 114. In some embodiments, the transistor 132 can comprise droplets of semiconductor material (e.g., silicon) with different dopings (e.g., N and P dopings) and/or concentrations of dopings. The droplets of the variously doped semiconductor material can be deposited to form the transistor 132 by disposing the droplets to form patterns of differently doped semiconductor material that makes the transistor 132.

A diode 134 can similarly be formed within a trace 114, between two traces 114, or between a trace 114 and another electrical entity (not shown). Like transistor 132, diode 134 can comprise droplets of semiconductor material (e.g., silicon) with different dopings (e.g., N or P dopings) and/or concentrations of dopings. The droplets of the variously doped semiconductor material can be deposited in a pattern that forms a diode 134.

A complex circuit 130 can be formed and connected to one or more of the traces 114. The complex circuit 130 can comprise two or more of any of the circuit elements mentioned herein or other circuit elements.

The resistors 121, 131, capacitor 115, inductor 125, transistor 132, diode 134, and complex circuit 130 of FIG. 11A are illustrated in schematic form in FIG. 11A. The resistors 121, 131, capacitor 115, inductor 125, transistor 132, diode 134, and complex circuit 130 as well as the traces 114 can be made by depositing on electronic device 100 layers of droplets comprising different materials with different properties (e.g., electrically conductive, electrically non-conductive, high K dielectric, a P doped semiconductor material, an N doped semiconductor material, etc.) as generally discussed above.

Figure 11B:
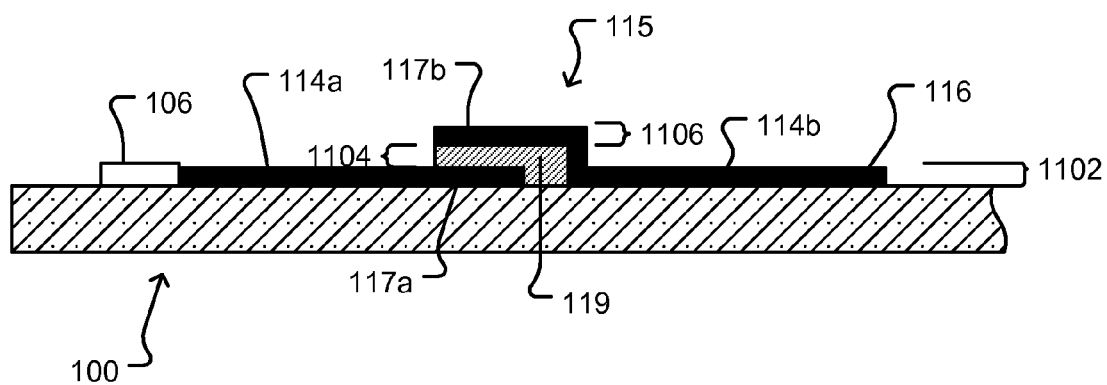
FIG. 11B shows a partial side view of the electronic device of FIG. 11A illustrating formation of the capacitor of FIG. 11A according to some embodiments of the invention.

FIG. 11B illustrates an example in which capacitor 115 is made in a plurality of layers 1102, 1104, 1106 of droplets of different material on electronic device 100 (which is shown in partial view only in FIG. 11B). As shown, a first portion of a trace 114a and a lower plate 117a of the capacitor 115 as well as a second portion of trace 114b can be formed by depositing on electronic device 100 electrically conductive droplets in a first layer 1102 of droplets. As also shown in FIG. 11B, the first layer 1102 of droplets can also include droplets comprising the dielectric material 119 between the first portion of trace 114a and the second portion of trace 114b. Droplets comprising the dielectric material 119 can be deposited between plates 117a, 117b as shown in FIG. 11B in a second layer 1104 of droplets. Electrically conductive droplets can also be deposited in the second layer 1104 of droplets to electrically connect the second portion of trace 114b with the upper plate 117b as shown in FIG. 11B. Still referring to FIG. 11B, electrically conductive droplets forming the upper plate 117b of the capacitor 115 can be deposited as part of a third layer 1106 of droplets. Although not shown, other droplets can be deposited in any of the layers 1102, 1104, and 1106, and additional layers of droplets can be deposited.

In some embodiments, enhanced electrical performance can be achieved by locating a resistor (e.g., resistor 121 and/or 131), a capacitor (e.g., capacitor 115), and/or an inductor (e.g., inductor 125) as close as possible to another electrical element. For example, referring again to FIGS. 8A and 8B, in some instances, decoupling capacitors and/or noise-reduction capacitors can function more effectively the closer they are connected to probes 126. As another example, isolation resistors are, in some instances, best placed as close to probes 126 as possible.

Figure 12:
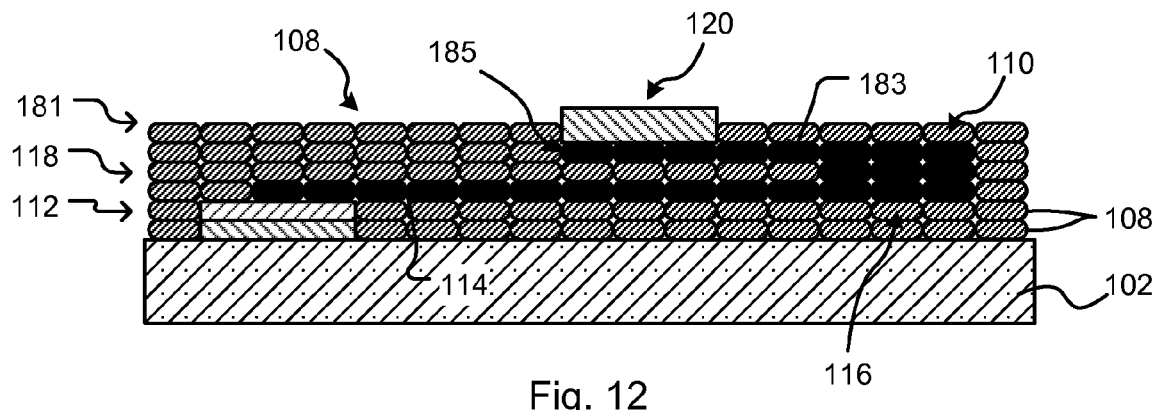
FIG. 12 shows the electronic device of FIG. 6B with additional droplets forming exemplary second redistribution traces according to some embodiments of the invention.

The process of forming redistribution traces on an electronic component can include forming multiple levels of redistribution traces. As shown in FIG. 12, this can be accomplished by depositing a plurality of droplets 110 of conductive material on the substrate (e.g., on the second non-conductive layer 118 and exposed opposite ends 116 of traces 114 shown in FIG. 5B) to form a plurality of second redistribution traces 183 (which can be like and can be formed like traces 114) electrically connected to and extending from the exposed opposite ends 116 of the redistribution traces 114 to similar opposite ends 185 (which can function as terminals and can be non-limiting examples of second terminals in a second pitch or second pattern) of the second redistribution traces 183. (Although for ease of illustration traces 183 are illustrated as comprising one layer of droplets 110, traces 114 can comprise many layers of droplets 110.) Electrical contact structures 120 can be formed at the opposite ends 185 of the second redistribution traces 183. In this manner, multiple layers of redistribution traces can be formed, which can allow, for example, ones of the traces to cross over others of the traces. For example, such a second redistribution trace 183 can cross one or more of the redistribution traces 114 without electrically connecting to the one or more redistribution traces 114 crossed. As shown in FIG. 12, droplets 108 of non-conductive material can be optionally deposited on the substrate 102 to form a layer 181 (e.g., a third non-conductive layer) that protects and/or electrically insulates the second redistribution traces 183. (Although for ease of illustration layers 181 are illustrated as comprising one layer of droplets 108, layers 181 can comprise many layers of droplets 110.) Layer 181 can include openings exposing portions (e.g., opposite ends 116) of traces 114. In some embodiments, more than three levels of redistribution traces can be formed.

Layers 112, 118, and 181 and redistribution traces 114 and 183 can be non-limiting examples of redistribution layers. In addition, as illustrated in FIG. 12 and described above, a redistribution trace 114 can be connected to a redistribution trace 183 forming a multiple layer redistribution trace comprising trace 114 and trace 183 (in which trace 114 can be a non-limiting example of a first part of the redistribution trace and trace 183 can be a non-limiting example of a second part of the redistribution trace).

There are many possible uses and applications for an electronic component, like the exemplary electronic component 100 illustrated in FIGS. 1A-8B. As mentioned, substrate 102 can be a semiconductor die and terminals 104 can be bond pads of the die. As also mentioned, such a die can be singulated from the wafer on which the die was made, or the die can be one of many dies that are as yet unsingulated from the wafer on which the dies were made. In such a case, multiple ones of the dies of the wafer can be processed in accordance with the process illustrated in FIGS. 1A-8B.

Figure 13:
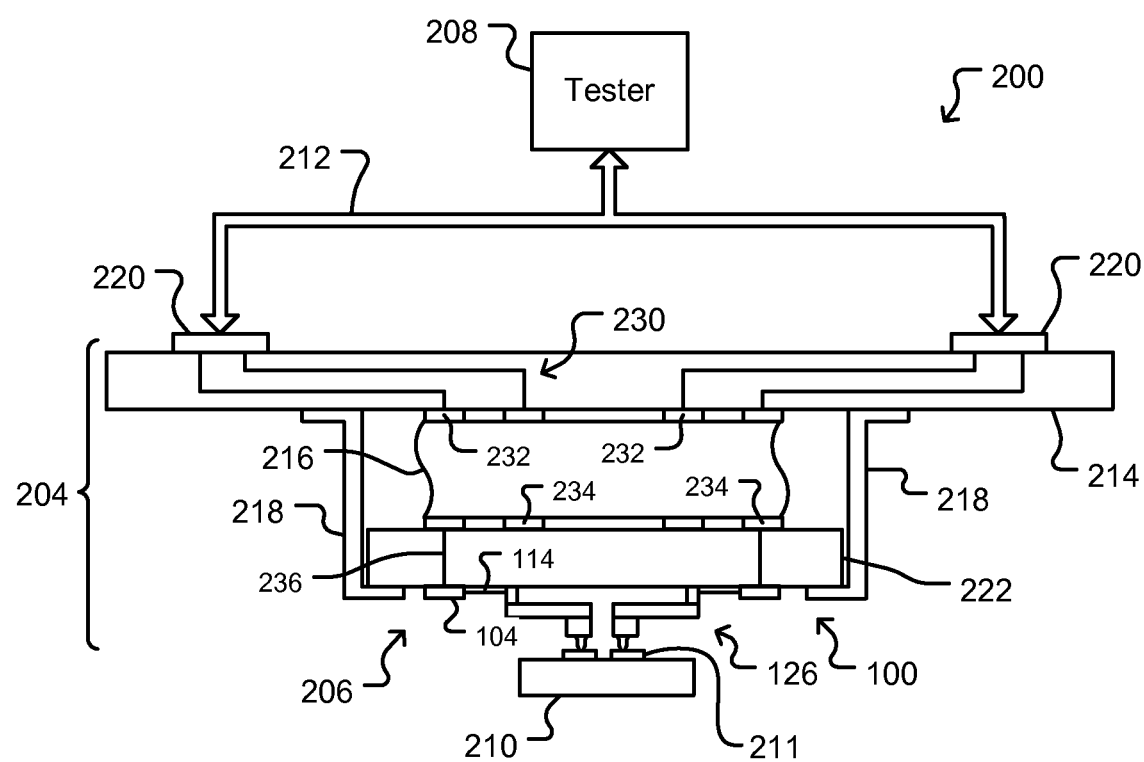
FIG. 13 is a schematic illustration of an exemplary test system, and the electronic component can be a probe head in the exemplary probe card assembly of the test system according to some embodiments of the invention.

FIG. 13 illustrates another exemplary application of the process illustrated in FIGS. 1A-8B according to some embodiments of the invention. FIG. 13 illustrates an exemplary test system 200, including an exemplary probe card assembly 204 that can have a probe head 206 that can comprise the electronic component 100 of FIGS. 1A-8B according to some embodiments of the invention. That is, the probe head 206 of the probe card assembly 204 shown in FIG. 13 can comprise the electronic component 100 illustrated in FIGS. 1A-8B. For example, probe head 206 can be or can comprise substrate 100 with layers 112, 118 of droplets forming redistribution traces 114, and probes 126 of FIG. 13 can be or can comprise probes 126. Test system 200, including probe card assembly 204, is shown in simplified schematic and block diagram form in FIG. 13.

As shown in FIG. 13, the test system 200 can comprise a tester 208, which can be configured to control testing of one or more DUTs 210. For example, the tester 208, which can comprise one or more computers, can control functional testing of DUT 210 by generating test signals to be input into DUT 210. (The tester 208 can thus be a source of test signals.) Tester 208 can receive response signals output by the DUT 210 in response to the test signals, and tester 208 can evaluate the response signals to determine whether the DUT 210 passes the testing and/or to rate the DUT 210. For example, the tester 208 can compare the response signals to expected response signals. The tester 208 can also control other types of testing of DUT 210.

As used herein, the term "DUT" (e.g., device under test) can be one or more semiconductor dies of an unsingulated semiconductor wafer, one or more semiconductor dies singulated from a wafer (packaged or unpackaged), one or more semiconductor dies of an array of singulated semiconductor dies disposed in a carrier or other holding device, one or more multi-die electronics modules, one or more printed circuit boards, and/or any other type of electronic component or devices. (A DUT can be an example of an electronic device or electronic devices to be tested.) The representation of DUT 210 with exemplary terminals 211 in FIG. 13 is thus not limited to a single device but can encompass a plurality of devices to be tested each comprising many terminals.

Test signals generated by the tester 208 can be provided to input terminals of the DUT 210 through a plurality of communications channels 212 and the probe card assembly 204. Response signals generated by the DUT 210 in response to the test signals can similarly be provided from output terminals of the DUT 210 through the probe card assembly 204 and the communications channels 212 to the tester 208.

The communications channels 212 can comprise any means suitable for providing a plurality of communications paths to and from the tester 208. For example, the communications channels 212 can comprise a plurality of electrical cables (e.g., coaxial cables), a plurality of electrical wires, a plurality of fiber optic cables, wireless transmitters and receivers, etc.

As shown in FIG. 13, the probe card assembly 204 can comprise a wiring substrate 214 (which can be a non-limiting example of a substrate according to some embodiments of the invention), an electrical connector 216, and a probe head 206, which can be held together by brackets 218, clamps, screws, bolts, and/or other suitable means. (Wiring substrate 214, probe head 206, and/or electrical connector 216 can be a non-limiting example of a component or another component of a probe card assembly.) The wiring substrate 214 can include electrical connectors 220 configured to make individual electrical connections with communications channels 212 to and from the tester 208. (Electrical connectors 220 can be a non-limiting example of an electrical interface or a signal interface to a tester.)

Connectors 220 can be pads for receiving pogo pins, zero-insertion-force connectors, or any other electrical connection device suitable for making electrical connections with communications channels 212. The wiring substrate 214 can be, for example, a printed circuit board and can include conductive paths 230, which can provide electrical connections from individual electrical connections in connectors 220 (each such individual electrical connection can correspond to one of the plurality of communication channels 212) to electrically conductive terminals 232 on an opposite surface of the wiring substrate 214. Electrical connector 216 can provide electrical connections between terminals 232 of the wiring substrate 214 and electrically conductive terminals 234 of a substrate 222 (which can be a non-limiting example of a base substrate). Terminals 234 can be electrically connected to terminals 104 on an opposite side of substrate 222 by electrically conductive paths 236 (e.g., traces and/or vias on and/or through the substrate 222). As discussed above with respect to FIGS. 1-8B and 9-12, redistribution traces 114 can connect terminals 104 to probes 126. Substrate 222 can be like substrate 102 of FIG. 1 with terminals 104 but can also include terminals 234 and electrical connections 236 (e.g., electrically conductive traces and/or vias on, in, and/or through substrate 222). Substrate 222 can be a non-limiting example of a base substrate or a probe substrate and can comprise any structure suitable for supporting terminals 104 and 234. For example, substrate 222 can be a printed circuit board or can comprise ceramic. Traces 114 can be made and probes 126 can be attached to ends 116 of traces 114 as shown in FIGS. 1-8B or alternatively as shown in FIGS. 9-12.

The electrical connector 216 can be flexible or compliant and can comprise, for example, spring elements. In some embodiments, the electrical connector 216 can comprise an interposer substrate (not shown) with electrically conductive spring contact structures (not shown) extending from opposing surfaces of the interposer (not shown). In such an embodiment, the electrical connector 216 can comprise spring contacts and electrical connections through the interposer substrate between spring contacts on one surface and spring contacts on another surface of the interposer substrate. In other embodiments, electrical connector 216 can comprise flexible wires or other flexible electrical connections. In still other embodiments, electrical connector 216 need not be appreciably flexible or compliant. For example electrical connector 216 can comprise material (e.g., solder) that directly connects the probe head 206 to the wiring substrate 214.

Terminals 211 of the DUT 210 and contact tips of the probes 126 can be brought into contact one with another and moved past first contact such that the contact tips and the terminals are pressed against one another. In response, the probes 126 can be compliant and move in response to a force or forces of the probes 126 against the DUT 210.

Figure 14:
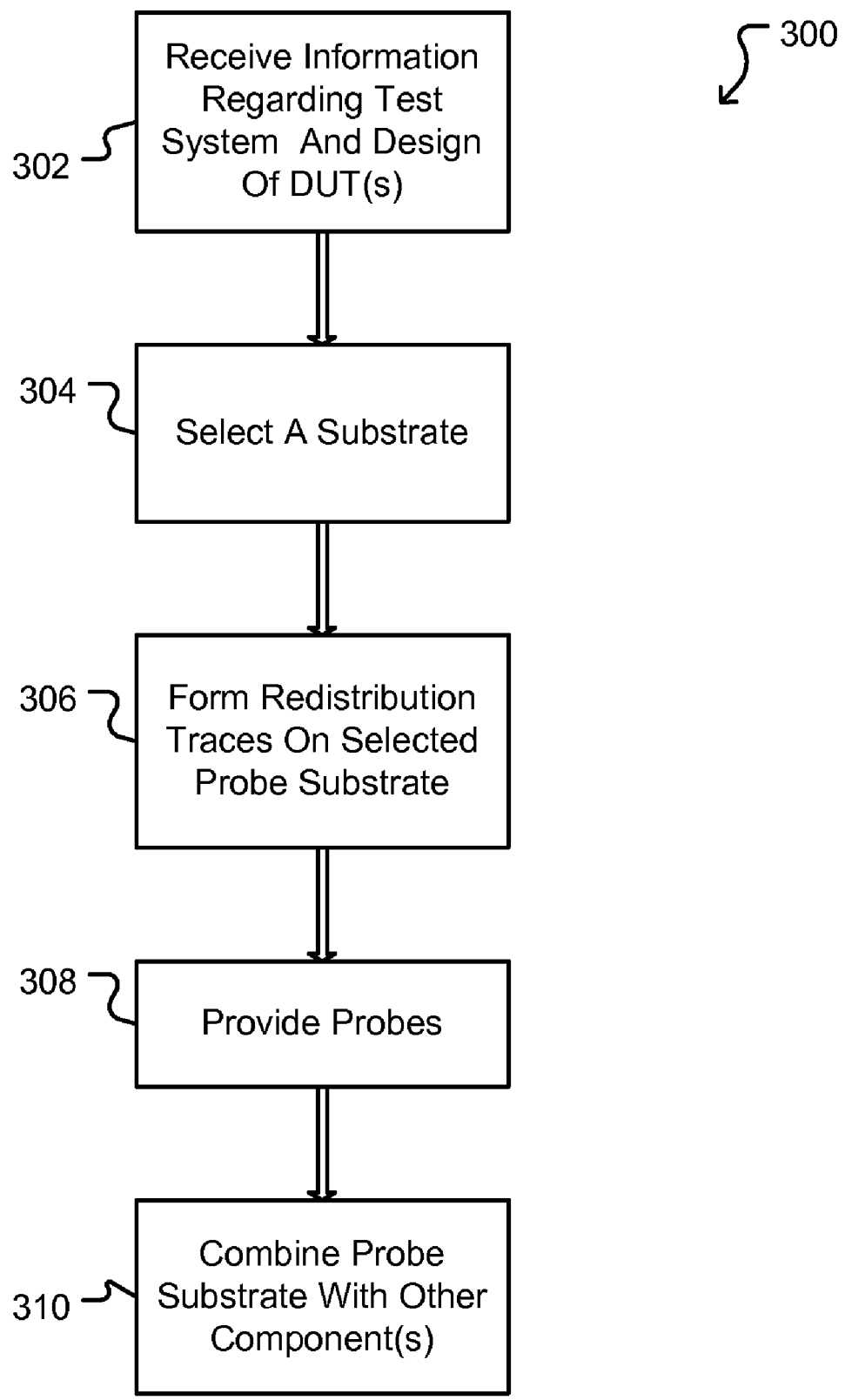
FIG. 14 illustrates an exemplary process for making a probe card assembly according to some embodiments of the invention.

FIG. 14 illustrates an exemplary process 300 for making a probe card assembly, for example, like probe card assembly 204 of FIG. 13 according to some embodiments of the invention. Although the process 300 is not limited to making the probe card assembly 204 but can be used to make other probe card assemblies, for ease of discussion and purposes of illustration, process 300 will be discussed below with regard to an example in which probe card assembly 204 is made.

As shown, information regarding design of one or more DUTs 210 (e.g., which can be a non-limiting example of design information regarding an electronic or semiconductor device or devices) and a test system 200 for testing the DUTs 210 can be received (at 302 of the process 300 of FIG. 14). (DUTs 210 can be non-limiting examples of semiconductor devices.) The information regarding the DUTs 210 can include, for example, a description of input and/or output terminals 211 of DUT 210. For example, the information can describe a pattern in which terminals 211 are laid out or located on each DUT 210, and the information can identify the type of input and/or output signals (e.g., power input, ground input, address bit, data bit, etc.) associated with each of some or all of terminals 211. Information regarding the test system 200 can include, for example, a description of communications channels 212 to and from a tester 208 of the test system 200. For example, information regarding the test system 200 can identify the type of signal (including power or ground) to be carried on each channel 212.

Figure 15:
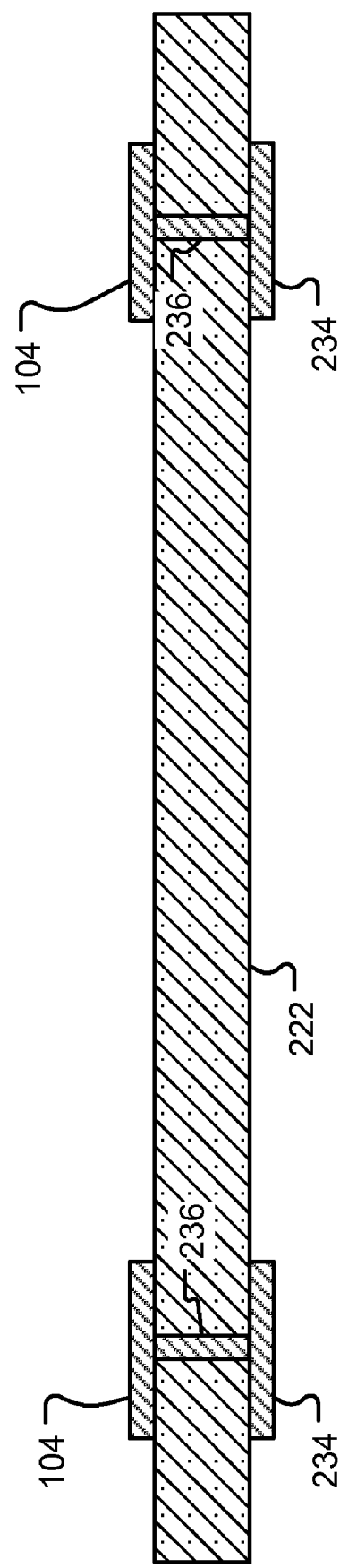
FIG. 15 illustrates an exemplary substrate.

A substrate 222 that will comprise probe head 206 of the probe card assembly 204 can be obtained (at 304 of the process 300 of FIG. 14). FIG. 15 illustrates a non-limiting example of substrate 222 that can be obtained (at 304 of the process 300 of FIG. 14). As discussed above with regard to FIG. 13 and as shown in FIG. 15, substrate 202 can include electrically conductive terminals 104 one side, electrically conductive terminals 234 on another side, and electrical connections 236 connecting terminals 234 and 104. Terminals 234 can be disposed in a pattern that corresponds to flexible connector 216, which can be a same or similar pattern as terminals 232 of wiring substrate 214 (see FIG. 13). Terminals 104 can be disposed in any convenient pattern.

In some embodiments, substrate 222 can be custom made for the DUTs 210 to be tested and test system 200 to be used to test the DUTs 210 whose information is received (at 302 of the process 300 of FIG. 14). In such a case, substrate 222 can be made after 302 of process 300, and substrate 222 can be customized to some or all of the information regarding DUTs 210 and tester 208 received (at 302 of the process 300 of FIG. 14).

In other embodiments, however, substrate 222 can be a standard, pre-manufactured configuration. For example, substrate 222 can be manufactured prior to 302 of process 300. For example, the pattern of terminals 234 and terminals 104 need not be customized for the information received (at 302 of the process 300 of FIG. 14) but can be standard patterns. As a non-limiting example, the pattern of terminals 234 can correspond to a common or expected pattern of flexible connector 216, which can correspond to a common or expected pattern of terminals 232 of wiring substrate 214. Terminals 104 can have the same or a different pattern than terminals 234. The pattern of terminals 104 on substrate 222 can but need not correspond to a pattern of input and/or output terminals 211 of DUTs 210, because as will be seen, redistribution traces 114 can be formed on substrate 222. Although not shown in FIG. 14, the process 300 can include obtaining or making a plurality of standard, pre-manufactured substrates like substrate 222 each with a different pattern for one or both of terminals 234 and/or terminals 104 prior to obtaining the information (at 302 of the process 300 of FIG. 14), an one of those substrates 222 can be selected (at 304 of the process 300 of FIG. 14).

Figure 16A:
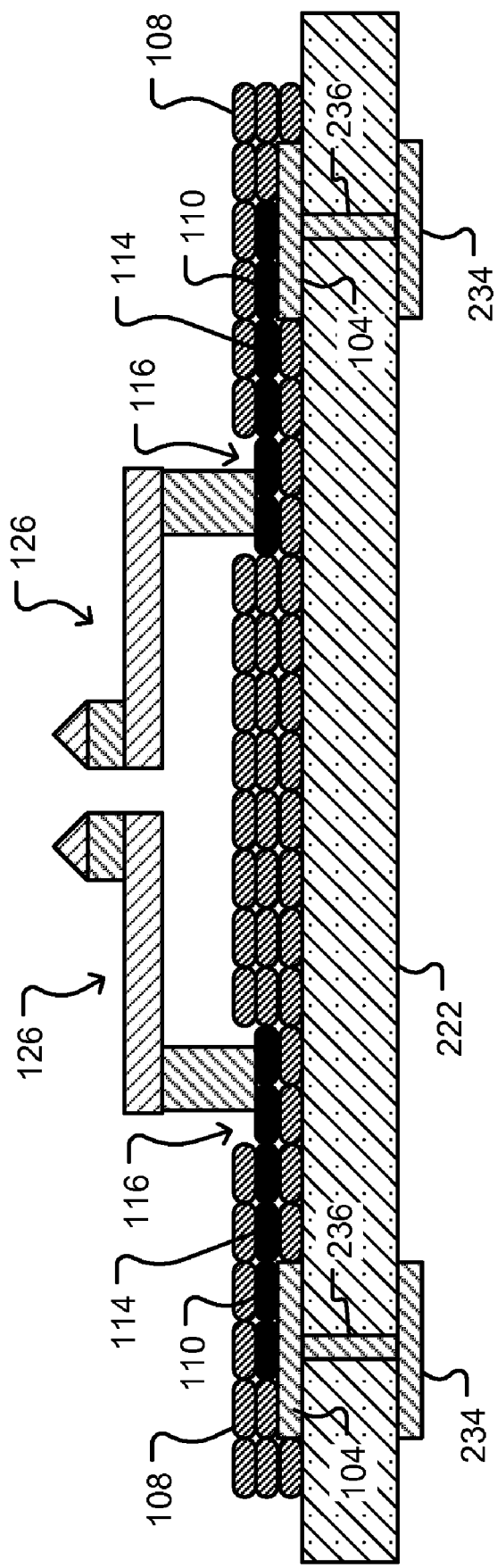
FIG. 16A shows the substrate of FIG. 15 with redistribution layers and spring probes.

Regardless of whether substrate 222 obtained (at 304 of the process 300 of FIG. 14) is custom made after receiving the information regarding DUTs 210 and test system 200 or is a standard, pre-manufactured substrate made prior to 302 as discussed above, redistribution traces 114 can then be formed on substrate 222 (at 306 of the process 300 of FIG. 14). The redistribution traces 114 can provide conductive areas to which probes for contacting terminals 211 of DUT 210 can be attached. For example, as shown in FIG. 16A, redistribution traces 114 can electrically connect terminals 104 with the conductive areas (e.g., ends 116 of traces 114) to which probes 126 can be attached. The traces 114—and in particular ends 116 of traces 114—can be placed so that probes 126 can be positioned such that the contact tips of probes 126 correspond to (e.g., are substantially the same as) a pattern of terminals 211 of DUTs in accordance with the information received (at 302 of the process 300 of FIG. 14). (A pattern of the contact tips of probes 126 can be substantially the same as a pattern of terminals 211 of DUTs 210 if the tips can be sufficiently aligned with terminals 211 such that the tips can be brought into contact with the terminals.) The redistribution traces 114 can be formed generally as shown in FIGS. 1A-8B or alternatively generally as shown in FIGS. 9-12.

Figure 17:
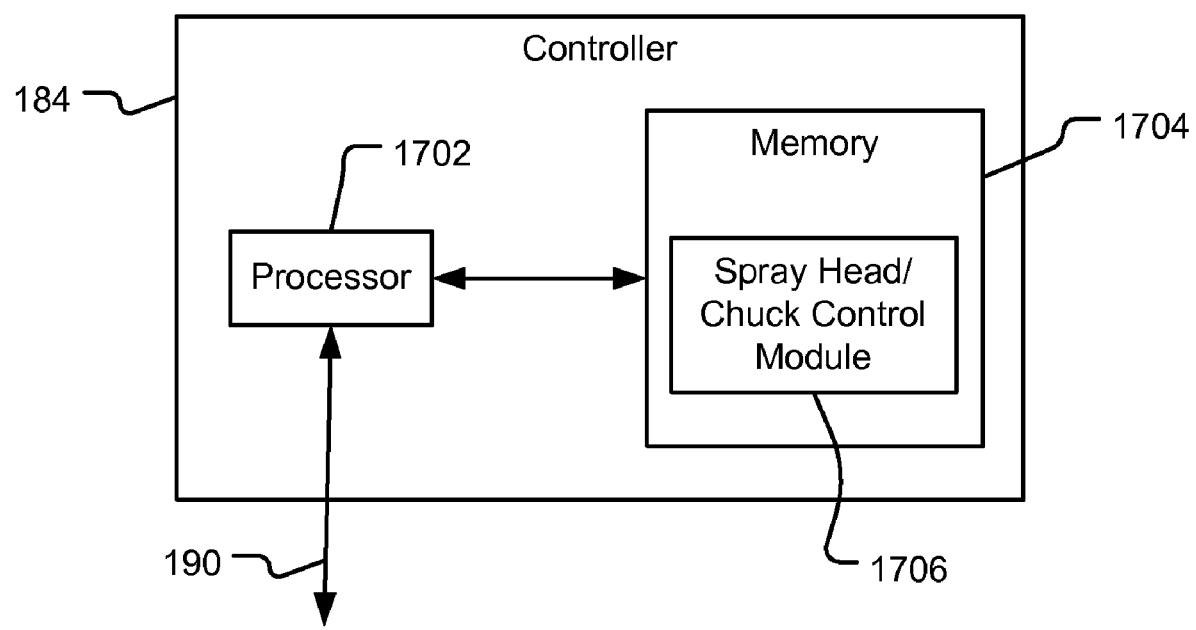
FIG. 17 illustrates an exemplary embodiment of the controller of FIG. 10 according to some embodiments of the invention.

In some embodiments, a system like system 170 of FIG. 10 can be used to deposit the droplets. As mentioned above with respect to FIG. 10, a controller 184 can output control signals 190 to control spray head 150 and/or chuck 180. FIG. 17 illustrates an embodiment in which controller 184 of FIG. 10 comprises a processor 1702 that can operate in accordance with instructions stored in a digital memory 1704. Processor 1702 can be, without limitation, one or more microprocessors, microcontrollers, computers, computer systems, or other types of digital circuits configured to operate under control of instructions stored in memory 1704. Memory 1704 can be any type of digital memory suitable for storing instructions that can be executed by processor 1702. Non-limiting examples of memory 1704 include a semiconductor memory, a magnetic memory, or an optical memory. As shown in FIG. 17, memory 1704 can store a spray head/chuck control module 1706, which can comprise instructions that cause processor to output control signals 190 to control spray head 150 and/or chuck 180 to deposit droplets as shown, for example, generally in FIGS. 1A-8B, 11, and/or 12. For example, the spray head/chuck control module 1706 can cause the processor 1702 to output control signals 190 that move chuck 180 to selectively position a desired point or area of substrate 222 (which can replace base substrate 102 in FIG. 10) below spray head 150, and spray head/chuck control module 1706 can cause processor 1702 to output signals 190 that cause spray head 150 to deposited on one or more selected droplets of a particular material. Instructions that comprise spray head/chuck control module 1706 can be, without limitation, software, microcode, firmware, or any other type of instructions that can be read and executed by processor 1702. Moreover, the instructions that comprise spray head/chuck control module 1706 can be in a compiled state or can be in an uncompiled state that, after being compiled, can be read and executed by processor 1702. FIG. 17 is exemplary only, and controller 184 can be in other configurations. For example, controller 184 can comprise in whole or in part hardwired digital logic circuits.

As mentioned, the conductive areas can be opposite ends 116 of redistribution traces 114, and the redistribution traces 114 can be formed in a pattern to correspond generally to the pattern of terminals 211 received in the information regarding design of the one or more DUTs 210 (at 302 of the process 300 of FIG. 14). For example, the opposite ends 116 can be positioned in a pattern so that probes 126 can be attached to the opposite ends 116 of the traces 114 (at 308 of the process 300 of FIG. 14) and the tips of the probes that contact the terminals 211 of the DUTs 210 are disposed in the same or similar pattern as the terminals 211.

Figure 16B:
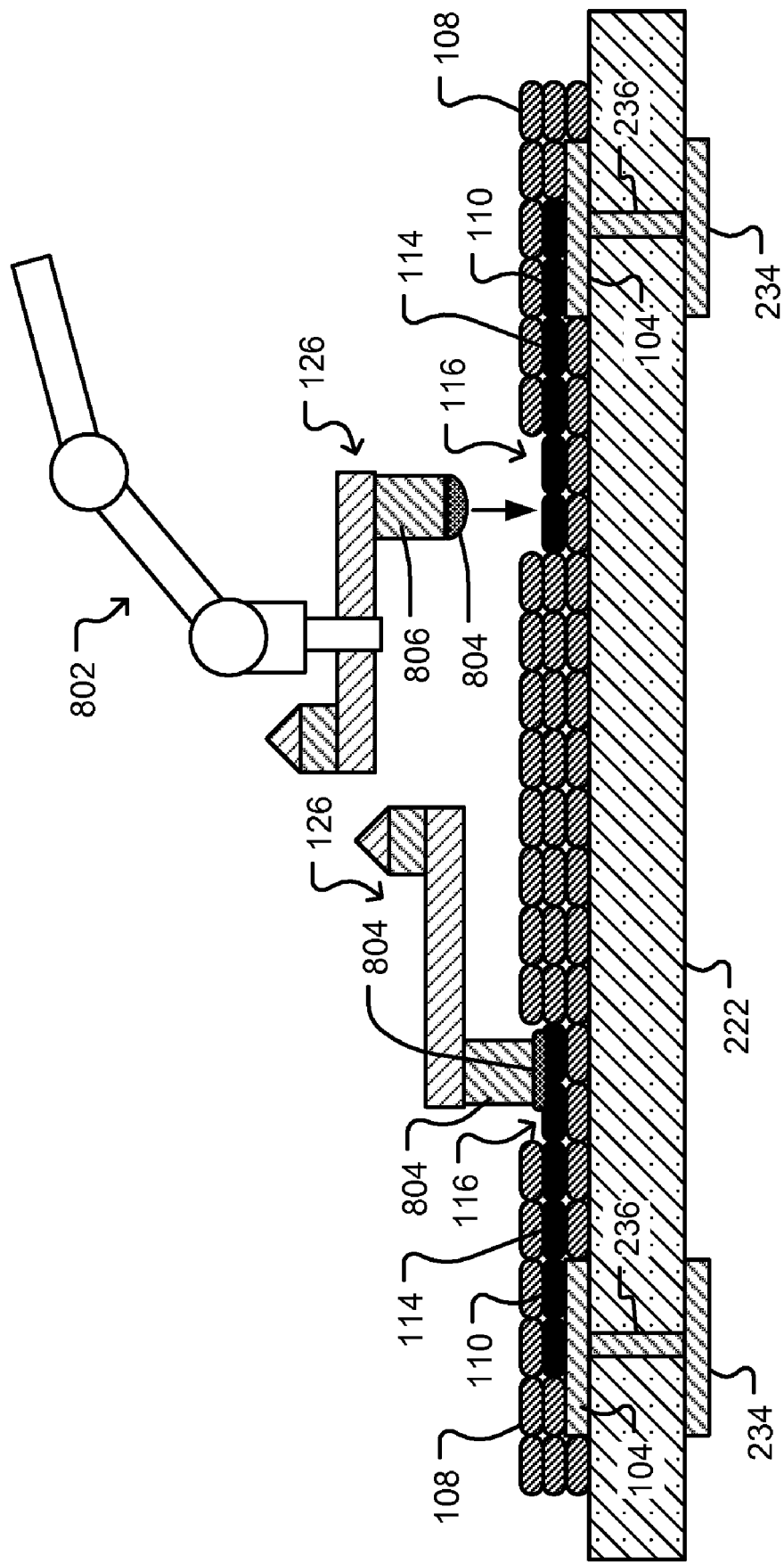
FIG. 16B illustrates use of a pick-and-place machine to position the spring probes according to some embodiments of the invention.

The probes 126 can be attached to the ends 116 of the traces 114 in any suitable manner. For example, as shown in FIG. 16B, the pick-and-place machine 802 discussed above with respect to FIGS. 8C and 8D can be used to grasp individual, loose probes 126 and position bases 806 of the probes 126 on ends 116 of the traces 114 according to some embodiments of the invention. As discussed above with respect to FIGS. 8C and 8D, a joining material 804 can adhere the bases 804 to the ends 116 of the traces 114.

Figure 16C:
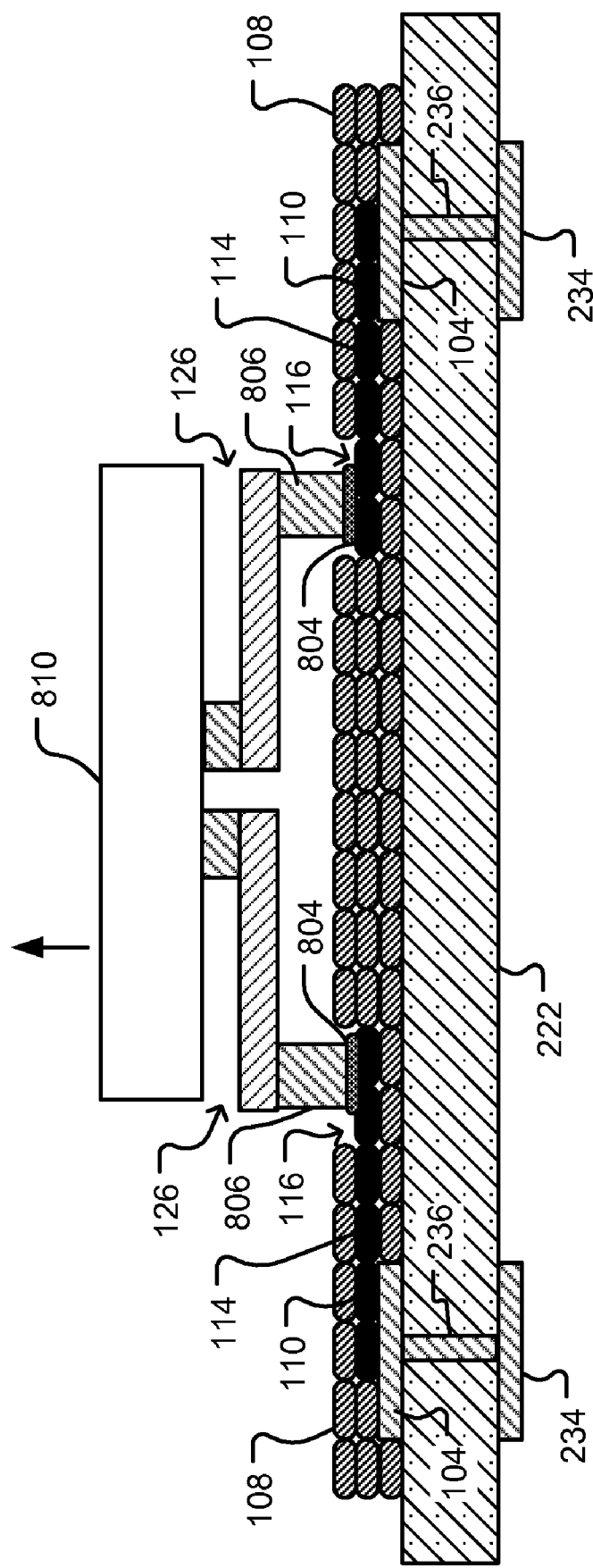
FIG. 16C illustrates transfer of the spring probes from a sacrificial substrate according to some embodiments of the invention.

Another example is shown in FIG. 16C. The probes 126 can be made on a sacrificial substrate 810 as discussed above with respect to FIGS. 8E and 8F. The bases 806 of the probes 126 can be positioned on ends 116 of the traces 114 and attached to the ends 116 of the traces 114 by a joining material 804. The probes 126 can then be released from the sacrificial substrate 810, which can be removed as discussed above with respect to FIGS. 8E and 8F.

Figure 16D:
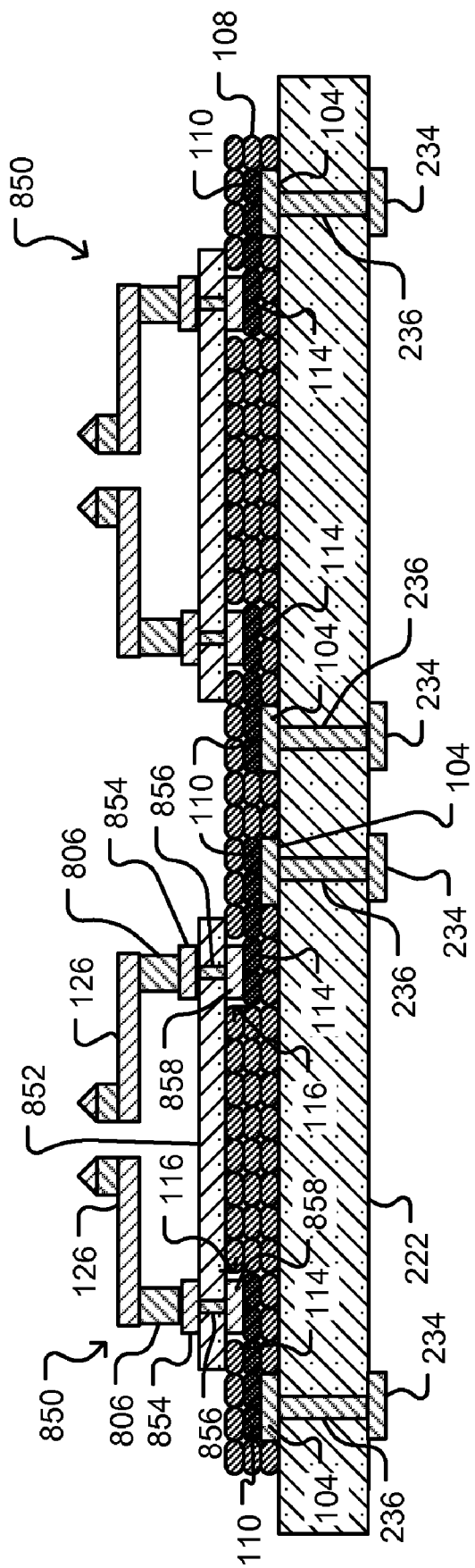
FIG. 16D illustrates tile assemblies attached to the redistribution traces according to some embodiments of the invention.

Yet another example is shown in FIG. 16D. Tile assemblies 850 can be attached to ends 116 of the traces 114. As discussed above with respect to FIG. 8G, the tile assemblies 850 can each include a substrate 852 with terminals 854 to which the probes 126 are attached. The terminals 854 can be connected by electrical connections 856 to terminals 858 on the other side of the substrate 852. The terminals 858 can be attached (e.g., by the joining material 804 of FIG. 8C) to ends 116 of the traces 114 as discussed above with respect to FIG. 8G. (As previously mentioned, the terminals 854 can be examples of third terminals on a first surface of substrate 852, and the terminals 858 can be examples of fourth terminals on a second surface of the substrate 852.)

Figure 16E:
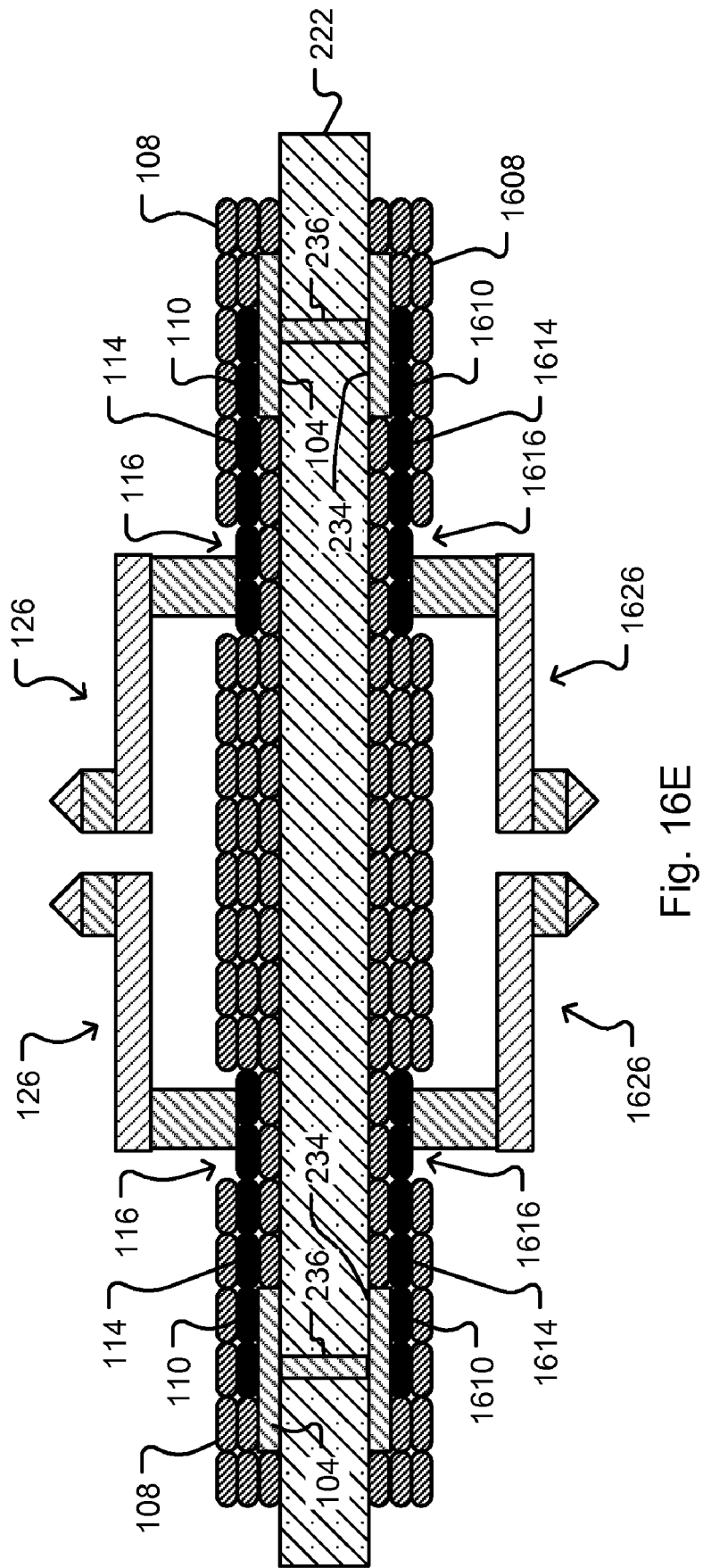
FIG. 16E illustrates a device with redistribution traces on opposite surfaces of the device according to some embodiments of the invention.

As shown in FIG. 16E, in some embodiments, redistribution traces 1614 can be formed on another surface of the substrate 222. The traces 1614 can be formed by a second type of droplets 1610 that are electrically conductive and are deposited with a first type of droplets 1608 that are not electrically conductive. The first type of droplets 1608 can be the same as and can be deposited like the first type of droplets 108. Similarly, the second type of droplets 1610 can be the same as and can be deposited like the first type of droplets 110. The traces 1614 can be generally the same as the traces 114. As shown, probes 1626 (which can be like probes 126) can be attached to ends 1616 of the traces 1614. The redistribution traces 1614 (including droplets 1608 and 1610) and the probes 1626 are optional and need not be included.

Returning to the discussion of the process 300 of FIG. 14, it is noted that the redistribution traces 114 including opposite ends 116 as well as any other layers of material (e.g., first non-conductive layer 112 and/or second non-conductive layer 118) added to the substrate 222 can constitute one or more customization or redistribution layers. Although not shown in FIG. 16A, in some embodiments, multiple layers of redistribution traces (e.g., redistribution traces 114 and 183 of FIG. 12) can be formed on the substrate 222 (e.g., at 306 of the process 300 of FIG. 14), and probes 126 can be attached to an opposite end (e.g., 185) of the outer traces 183 (e.g., at 308 of the process 300 of FIG. 14). After probes 126 are attached (at 308 of the process 300 of FIG. 14), the substrate 222 can be combined with one or more other components (e.g., wiring substrate 214, electrical connector 216, and/or brackets 218 of FIG. 13) to make a probe card assembly 204 (at 310 of the process 300 of FIG. 14).

Although specific embodiments and applications of the invention have been described in this specification, there is no intention that the invention be limited these exemplary embodiments and applications or to the manner in which the exemplary embodiments and applications operate or are described herein. For example, although terms "first," "second," etc. have been used to refer to droplets and layers, such terms have been used solely for convenience and ease of distinguishing different droplets and layers but not by way of any limitation.

The invention claimed is:

1. A probe substrate for use in testing semiconductor devices comprising:
 a base substrate comprising first electrical terminals at a first pitch and second electrical terminals at a second pitch different from the first pitch;
 a plurality of electrically conductive spring probes disposed on the base substrate and electrically connected to the second electrical terminals; and a three-dimensional array of droplets defining one or more redistribution layers comprising a plurality of redistribution traces extending from the first terminals to the second electrical terminals wherein first ones of the droplets are electrically conductive and define the redistribution traces and a second ones of the droplets are electrically non-conductive and support the redistribution traces.

2. The probe substrate of claim 1 further comprising electrically conductive connectors attached to the first terminals, wherein the redistribution traces extend from the conductive connectors to the second terminals.

3. The probe substrate of claim 1 wherein the electrical spring probes are disposed at the second terminals and the spring probes are suitable for effecting reliable pressure connections for testing semiconductor devices.

4. The probe substrate of claim 3 further comprising an adhesive that adheres the spring probes to the second terminals.

5. The probe substrate of claim 3, wherein the spring probes comprise additional droplets of conductive material deposited on the second terminals.

6. The probe substrate of claim 1 further comprising a tile assembly comprising:
a second substrate comprising third terminals disposed on a first surface of the second substrate and interconnected through the substrate to fourth terminals disposed on a second surface of the second substrate; and
spring probes attached to the third terminals,
wherein the fourth terminals are attached to the second terminals.

7. The probe substrate of claim 1, wherein the base substrate comprises ceramic.

8. The probe substrate of claim 1, wherein the redistribution layers further comprise a first layer of non-conductive droplets disposed between the surface of the base substrate and the redistribution traces.

9. The probe substrate of claim 8, wherein the redistribution layers further comprise a second layer of non-conductive droplets disposed to cover at least partially the redistribution traces.

10. The probe substrate of claim 1, wherein the redistribution layers further comprise:
a first layer of non-conductive droplets disposed between the surface of the base substrate and first parts of ones of the redistribution traces; and
a second layer of non-conductive droplets disposed between the first parts of ones of the redistribution traces and second parts of the ones of the redistribution traces,
wherein the first parts of the ones of the redistribution traces and the second parts of the ones of the redistribution traces are electrically connected by electrical connections that pass through the second layer of non-conductive droplets, the electrical connections comprising electrically conductive droplets.

11. The probe substrate of claim 1 further comprising an electronic component within the redistribution traces.

12. The probe substrate of claim 11, wherein the electronic component comprises a resistor, a capacitor, an inductor, a diode, or a transistor.

13. The probe substrate of claim 11 further comprising a plurality of electronic components within the redistribution traces, the electronic components interconnected to form an electric circuit.

14. A probe card assembly for testing semiconductor devices, comprising:
a wiring substrate comprising a signal interface to a tester for testing semiconductor devices;
a probe substrate comprising first electrical terminals at a first pitch on a surface of the probe substrate and second electrical terminals at a second pitch different from the first pitch on the surface of the probe substrate;
one or more redistribution layers disposed on the surface of the probe substrate, the redistribution layers comprising a three-dimensional array of droplets, wherein a first plurality of droplets of the array are an electrically conductive material forming a plurality of redistribution traces extending from the first terminals to the second electrical terminals and a second plurality of droplets of the array are an electrically non-conductive material supporting the redistribution traces;
a plurality of electrically conductive spring probes attached to the second electrical terminals, the spring probes comprising tips disposed in a pattern that corresponds to input and/or output terminals of the semiconductor devices to be tested; and
electrical connections connecting the signal interface to the first terminals.

15. The probe card assembly of claim 14, wherein the probe substrate comprises ceramic.

16. The probe card assembly of claim 14, wherein:
the probe substrate comprises third electrically conductive terminals disposed on a second surface of the probe substrate, the second surface opposite the surface on which the first terminals are disposed, the probe substrate further comprising electrically conductive paths through the probe substrate electrically connecting the first terminals and the third terminals; and
electrical connectors connecting electrical paths from the signal interface through the wiring substrate to the third terminals on the probe substrate.

17. The probe card assembly of claim 14, wherein the redistribution layers further comprise a first layer of non-conductive droplets disposed between the surface of the probe substrate and redistribution traces.

18. The probe card assembly of claim 14, wherein the redistribution layers further comprise:
a first layer of non-conductive droplets disposed between the surface of the probe substrate and first parts of ones of the redistribution traces; and
a second layer of non-conductive droplets disposed between the first parts of ones of the redistribution traces and second parts of the ones of the redistribution traces;
wherein the first parts of the ones of the redistribution traces and the second parts of the ones of the redistribution traces are electrically connected by electrical connections comprising conductive droplets that pass through the second layer of non-conductive droplets.

19. A method of making a probe substrate comprising:
providing a base substrate as a premanufactured component, the base substrate comprising a pattern of first electrical terminals on a surface of the substrate;
thereafter receiving information regarding semiconductor devices to be tested, the information including a pattern of input and/or output terminals of the semiconductor devices;
depositing a plurality of droplets of two or more materials onto the substrate, the droplets including electrically conductive droplets that form a plurality of redistribution traces extending from the first terminals to second electrical terminals in a second pattern on the surface of the substrate, wherein the second pattern is different than the first pattern and electrically non-conductive droplets that support the plurality of redistribution traces;

attaching electrically conductive spring probes to the second terminals, wherein the second pattern corresponds to the pattern of input and/or output terminals of the semiconductor devices such that a pattern of contact tips of the conductive spring probes is substantially the same as the pattern of input and/or output terminals of the semiconductor devices; and combining the base substrate with at least one other component to form the probe card assembly.

20. The method of claim 19, further comprising providing the base substrate as a ceramic.

21. The method of claim 19, wherein:
the at least one other component includes an electrical interface to a tester for controlling testing of the semiconductor devices, and
the combining comprises electrically connecting the first terminals to the electrical interface.

22. The method of claim 19, wherein the depositing comprises:
depositing a first layer of non-conductive droplets on the substrate; and
depositing electrically conductive droplets forming the redistribution traces on the first layer of non-conductive droplets.

23. The method of claim 19, wherein the depositing comprises:
depositing a first layer of non-conductive droplets on the substrate; and
depositing electrically conductive droplets forming first parts of ones of the redistribution traces on the first layer of non-conductive droplets;
depositing a second layer of non-conductive droplets on the first parts of the ones of the redistribution traces; and
depositing electrically conductive droplets forming second parts of ones of the redistribution traces on the first layer of non-conductive droplets and within openings in the second layer of non-conductive droplets to the first parts of the ones of the redistribution traces.

24. The method of claim 19, wherein the depositing comprises depositing the droplets using a spray head.

25. The method of claim 24, wherein the spray head is an ink jet print head.

26. The method of claim 24, wherein the depositing further comprises a processor executing instructions stored in a memory that controls the depositing of the droplets from the spray head.

27. The method of claim 26, wherein the processor executing instructions further controls positioning of a chuck on which the base substrate is disposed.

28. The method of claim 19, wherein the attaching electrically conductive spring probes comprises, for each of the spring probes:
positioning with a pick-and-place machine a base of the spring probe at one of the second terminals, and
attaching the base to the one of the second terminals.

29. The method of claim 19, wherein the attaching electrically conductive spring probes comprises:
positioning a sacrificial substrate to which the spring probes are attached such that bases of the spring probes are at the second terminals; and
attaching the bases to the second terminals.

* * * * *